(12) United States Patent
Chen et al.

(10) Patent No.: US 11,871,554 B2
(45) Date of Patent: Jan. 9, 2024

(54) SEMICONDUCTOR STRUCTURE, AND MANUFACTURING METHOD AND CONTROL METHOD THEREOF

(71) Applicant: CHANGXIN MEMORY TECHNOLOGIES, INC., Hefei (CN)

(72) Inventors: Tao Chen, Hefei (CN); ZhiCheng Shi, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 310 days.

(21) Appl. No.: 17/391,195

(22) Filed: Aug. 2, 2021

(65) Prior Publication Data

US 2022/0077158 A1 Mar. 10, 2022

Related U.S. Application Data

(63) Continuation of application No. PCT/CN2021/097909, filed on Jun. 2, 2021.

(30) Foreign Application Priority Data

Sep. 4, 2020 (CN) .......................... 202010921763.5

(51) Int. Cl.
*G11C 5/06* (2006.01)
*H10B 12/00* (2023.01)
(Continued)

(52) U.S. Cl.
CPC .......... *H10B 12/05* (2023.02); *G11C 11/4085* (2013.01); *H01L 29/66666* (2013.01);
(Continued)

(58) Field of Classification Search
CPC .... H10B 12/05; H10B 12/315; H10B 12/488; G11C 11/4085; H01L 29/66666; H01L 29/7827
(Continued)

(56) References Cited

U.S. PATENT DOCUMENTS 7,359,226 B2 * 4/2008 Schwerin ............... H10B 99/00
365/49.1
8,254,160 B2 * 8/2012 Murooka ........... G11C 13/0023
365/226
(Continued)

FOREIGN PATENT DOCUMENTS

| CN | 102637692 A | 8/2012 |
|---|---|---|
| CN | 102097412 B | 11/2012 |
| CN | 107093604 A | 8/2017 |

OTHER PUBLICATIONS

Supplementary European Search Report in the European application No. 21773442.5, dated May 6, 2022, 8 pgs.
(Continued)

*Primary Examiner* — Viet Q Nguyen
(74) *Attorney, Agent, or Firm* — Cooper Legal Group, LLC

(57) ABSTRACT

A semiconductor structure includes: a base substrate; an insulator, located on one side of the base substrate; bit lines, arranged in the insulator, the bit lines being distributed at intervals along first direction and extending along second direction; active bodies, located in the insulator, the active bodies being located on sides of respective bit lines facing away from the base substrate, orthographic projection of each active body on the base substrate at least partially coinciding with the orthographic projection of a respective bit line on the base substrate, and the active bodies being distributed at intervals along second direction; and word lines, located in the insulator and located on sides of respective bit lines facing away from the base substrate, the word lines being distributed at intervals along second direction and extending along first direction, and only one word line being arranged between two adjacent active bodies in second direction.

8 Claims, 24 Drawing Sheets

(51) Int. Cl.
  *G11C 11/408* (2006.01)
  *H01L 29/66* (2006.01)
  *H01L 29/78* (2006.01)

(52) U.S. Cl.
  CPC ....... *H01L 29/7827* (2013.01); *H10B 12/315* (2023.02); *H10B 12/488* (2023.02)

(58) Field of Classification Search
  USPC ..................................................... 365/230.1
  See application file for complete search history.

(56) References Cited

U.S. PATENT DOCUMENTS

| | | | | |
|---|---|---|---|---|
| 8,772,746 | B2* | 7/2014 | Kinoshita | ............ H10N 70/231 |
| | | | | 257/2 |
| 8,830,740 | B2* | 9/2014 | Sasago | .................. H10B 63/30 |
| | | | | 257/E47.001 |
| 10,998,316 | B2* | 5/2021 | Lee | ......................... H01L 24/32 |
| 2002/0109176 | A1* | 8/2002 | Forbes | ................ H10B 12/053 |
| | | | | 438/242 |
| 2003/0218199 | A1 | 11/2003 | Forbes | |
| 2005/0145911 | A1 | 7/2005 | Forbes | |
| 2008/0049486 | A1 | 2/2008 | Gruening-von Schwerin | |
| 2013/0056812 | A1* | 3/2013 | Kim | ....................... H10B 61/22 |
| | | | | 257/295 |
| 2013/0161710 | A1 | 6/2013 | Ji | |
| 2014/0021537 | A1* | 1/2014 | Kim | .................. H01L 29/42356 |
| | | | | 257/330 |
| 2015/0318295 | A1* | 11/2015 | Kai | ....................... H10B 41/35 |
| | | | | 257/319 |
| 2018/0069117 | A1 | 3/2018 | Cho et al. | |
| 2020/0202900 | A1* | 6/2020 | Kang | ................... H10B 12/03 |
| 2020/0286906 | A1* | 9/2020 | Karda | ................... H10B 41/27 |
| 2022/0254785 | A1* | 8/2022 | Lai | ...................... H10B 12/315 |

OTHER PUBLICATIONS

International Search Report in the international application No. PCT/CN2021/097909, dated Sep. 1, 2021, 2 pgs.

\* cited by examiner

SEMICONDUCTOR STRUCTURE, AND MANUFACTURING METHOD AND CONTROL METHOD THEREOF

CROSS-REFERENCE TO RELATED APPLICATIONS

This application is a continuation of International Application No. PCT/CN2021/097909, filed on Jun. 2, 2021, which claims priority to Chinese patent application No. 202010921763.5, filed on Sep. 4, 2020. The disclosures of International Application No. PCT/CN2021/097909 and Chinese patent application No. 202010921763.5 are hereby incorporated by reference in their entireties.

TECHNICAL FIELD

The disclosure relates to the technical field of storage, and in particular to a semiconductor structure, and a manufacturing method and control method thereof.

BACKGROUND

A memory generally includes multiple memory cells. Each memory cell includes a switch transistor and a capacitor. The memory generally provides a turn-off or turn-on signal to a gate of the switch transistor through a word line, and is connected with a source or drain of the switch transistor through a bit line to provide logic "1" or "0" to the capacitor through the switch transistor.

In the related art, the memory integrates the word line, the bit line, the switch transistor, and the capacitor on the same semiconductor structure. However, in the related art, the integration density of the switch transistor in the semiconductor structure is relatively low, thereby influencing the number of the memory cells in the semiconductor structure in unit size.

It is to be noted that information disclosed in the above background section is only used to enhance an understanding of the background of the disclosure, and thus may include information that does not constitute the conventional art known to those of ordinary skill in the art.

SUMMARY

According to one aspect of the disclosure, a semiconductor structure is provided, including: a base substrate, multiple bit lines, multiple active bodies, an insulator, and multiple word lines. The insulator is located on one side of the base substrate; the multiple bit lines are arranged in the insulator, and the multiple bit lines are distributed at intervals along a first direction and extend along a second direction; the multiple active bodies are located in the insulator, the active bodies are located on sides of respective bit lines facing away from the base substrate, orthographic projection of each active body on the base substrate at least partially coincides with the orthographic projection of a respective bit line on the base substrate, and the active bodies are distributed at intervals along the second direction; the multiple word lines are located in the insulator and located on sides of respective bit lines facing away from the base substrate, the word lines are distributed at intervals along the second direction and extend along the first direction, and only one word line is arranged between two adjacent active bodies in the second direction. In one exemplary embodiment of the disclosure, each active body includes: a first source or drain part, an active part and a second source or drain part. The first source or drain part is located on one side of a respective bit line facing away from the base substrate; the active part is located on one side of the first source or drain part facing away from the substrate base plat; and the second source or drain part is located on one side of the active part facing away from the base substrate.

According to one aspect of the disclosure, a manufacturing method of a semiconductor structure is provided, including the following operations. A to-be-etched body is formed. The to-be-etched body includes a base substrate, an insulator located on one side of the base substrate and multiple bit lines. The bit lines are located in the insulator, and the multiple bit lines are distributed at intervals along a first direction and extend along a second direction. Multiple second grooves which are distributed at intervals along the second direction and extend along the first direction are formed on one side of the insulator facing away from the bit lines. A word line and a fourth insulating layer are sequentially formed in each second groove. The fourth insulating layer is located on one side of the word line facing away from a bottom of the second groove. Multiple through holes distributed in an array are formed on one side of the insulator facing away from the base substrate. Orthographic projection of each through hole on the base substrate at least partially coincides with the orthographic projection of a respective bit line on the base substrate. The through hole extends to a surface of one side of the bit line facing the through hole. The orthographic projection of each through hole on the base substrate is located between the orthographic projections of two adjacent word lines on the base substrate. In the second direction, the orthographic projection of only one word line on the base substrate is located between the orthographic projections of two adjacent through holes on the base substrate. A fifth insulating layer is formed on one side of the word line exposed to the through hole. A first source or drain part, an active part and a second source or drain part are formed in each through hole. The first source or drain part is located on one side of the bit line, the active part is located on one side of the first source or drain part facing away from the bit line, and the second source or drain part is located on one side of the active part facing away from the bit line.

According to one aspect of the disclosure, a control method of a semiconductor structure is provided. The semiconductor includes base substrate, an insulator, a plurality of bit lines, a plurality of active bodies and a plurality of word lines. The method includes the following operation. A turn-on signal is simultaneously input to two adjacent word lines to turn on an active body located between the two word lines.

It is to be understood that both the foregoing general description and the following detailed description are exemplary and explanatory only and cannot limit the disclosure.

BRIEF DESCRIPTION OF THE DRAWINGS

The accompanying drawings are incorporated in and constitute a part of the specification, illustrate embodiments consistent with the disclosure, and are used to explain the principle of the disclosure, together with the specification. Apparently, for those skilled in the art, the drawings in the following description are only some embodiments of the disclosure, and other drawings may also be obtained from these drawings without involving any inventive effort.

DETAILED DESCRIPTION

Figure 1:
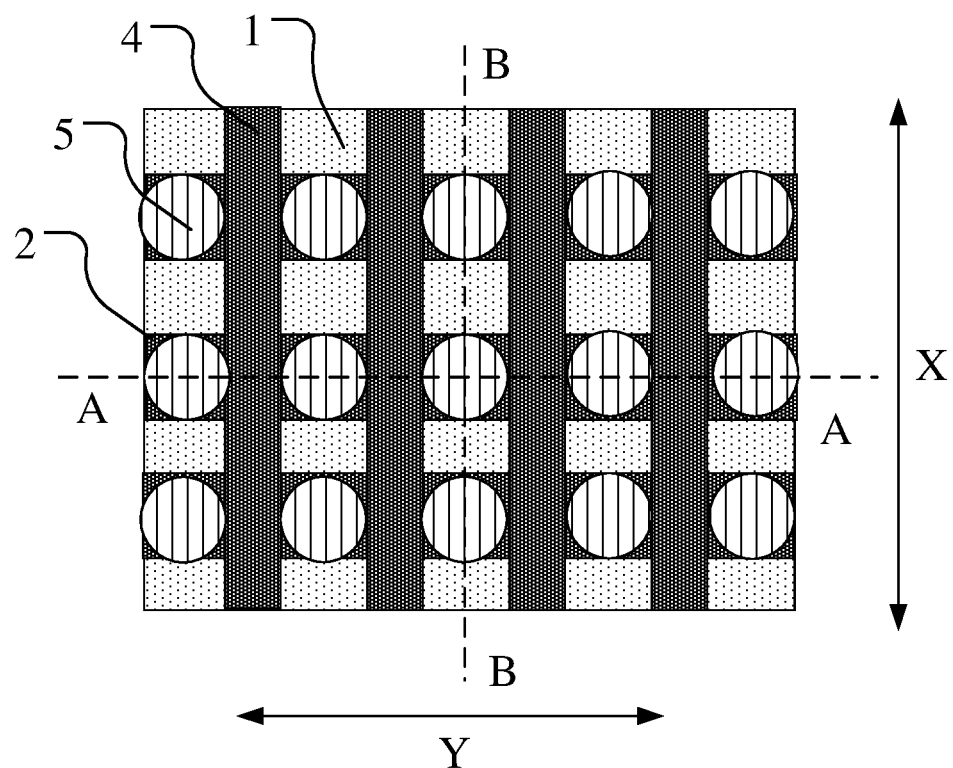
FIG. 1 is a top perspective view of one exemplary embodiment of a semiconductor structure of the disclosure.

Example embodiments will now be described more comprehensively with reference to the accompanying drawings. However, the example embodiments can be implemented in various forms and should not be construed as limited to the embodiments set forth herein; rather, these embodiments are provided so that the disclosure will be more thorough and complete, and will fully convey the concept of the example embodiments to those skilled in the art. Same reference numerals in the drawings indicate the same or similar structures, and therefore their detailed description will be omitted.

Although relative terms such as "upper" and "lower" are used in the specification to describe a relative relationship of one assembly of the reference numeral to another assembly, these terms are used in the specification for convenience only, for example, according to an orientation of the example illustrated in the figures. It will be appreciated that if an apparatus of the reference numeral is turned upside down, the "upper" component described above will become the "lower" component. Other relative terms such as "high", "low", "top", "bottom", "left", "right", and the like have similar meanings. When a structure is "on" another structure, it may mean that the structure is integrally formed with the other structure, or that the structure is "directly" arranged on the other structure, or that the structure is "indirectly" arranged on the other structure through the other structure.

The terms "a", "an", and "the" are used to indicate the presence of one or more elements/constituent parts/and the like. The terms "including" and "having" are used in an open inclusive sense and mean that there may be additional elements/constituent parts/and the like, in addition to the listed elements/constituent parts/and the like.

Figure 2:
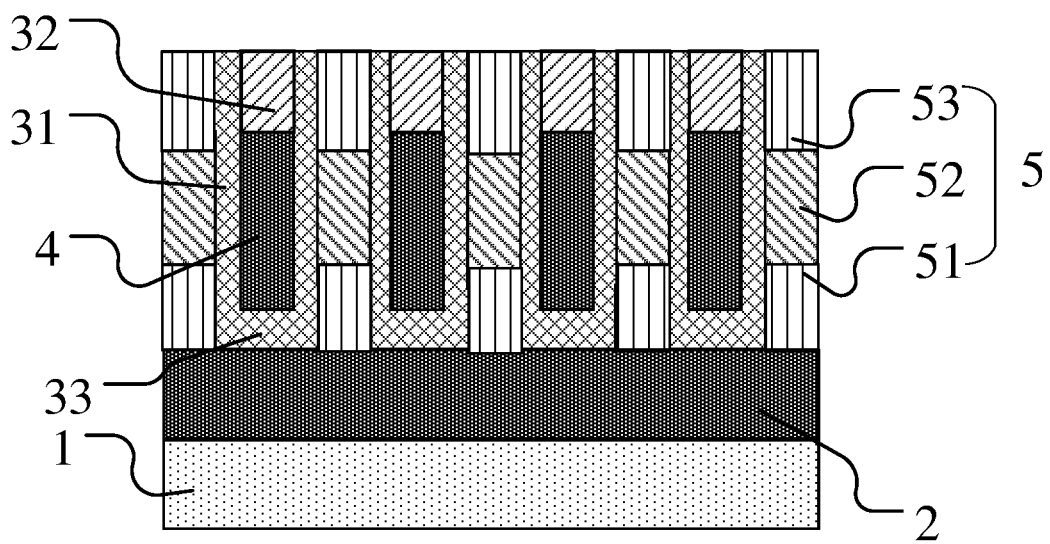
FIG. 2 is a cross-sectional view along a dotted line A-A in FIG. 1.
Figure 3:
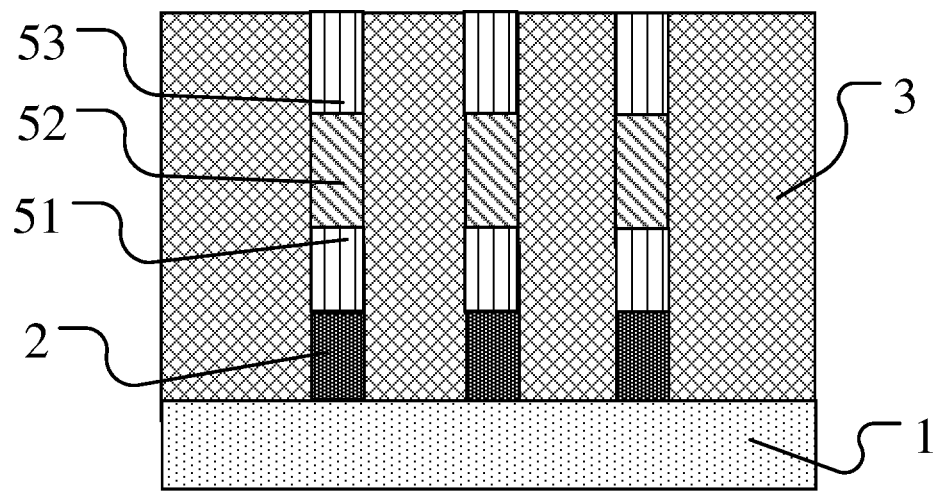
FIG. 3 is a cross-sectional view along a dotted line B-B in FIG. 1.

The exemplary embodiments provide a semiconductor structure, as shown in FIG. 1, FIG. 2, and FIG. 3. FIG. 1 is a top perspective view of one exemplary embodiment of a semiconductor structure of the disclosure. FIG. 2 is a cross-sectional view along a dotted line A-A in FIG. 1. FIG. 3 is a cross-sectional view along a dotted line B-B in FIG. 1. The semiconductor structure includes: a base substrate 1, multiple bit lines 2, multiple active bodies 5, an insulator 3, and multiple word lines 4. The insulator 3 is located on one side of the base substrate 1; the multiple bit lines 2 are arranged in the insulator 3, and the multiple bit lines 2 are distributed at intervals along a first direction X and extend along a second direction Y; the multiple active bodies 5 are located in the insulator 3, the active bodies 5 are located on sides of respective bit lines 2 facing away from the base substrate 1, orthographic projection of each active body 5 on the base substrate 1 at least partially coincides with the orthographic projection of a respective bit line 2 on the base substrate, and the active bodies are distributed at intervals along the second direction Y; the multiple word lines 4 are located in the insulator 3 and located on sides of respective bit lines 2 facing away from the base substrate 1, the word lines 4 are distributed at intervals along the second direction Y and extend along the first direction X, and only one word line 4 is arranged between two adjacent active bodies 5 in the second direction Y. The word line 4 may be insulated from the active body 5 and the bit line 2 through a part of the insulator 3.

In the exemplary embodiment, each active body 5 may include: a first source or drain part 51, an active part 52, and a second source or drain part 53. The first source or drain part 51 may be located on one side of a respective bit line 2 facing away from the base substrate 1; the active part 52 may be located on one side of the first source or drain part 51 facing away from the base substrate 1; and the second source or drain part 53 may be located on one side of the active part 52 facing away from the base substrate 1. The active body 5 may form a source or drain and a channel region of one switch transistor, and a part of the word line 4 may form a gate of the switch transistor. One side of the second source or drain part 53 facing away from the base substrate 1 may be exposed to outside the insulator, and a capacitor may also be arranged on one side of the second source or drain part 53 facing away from the base substrate 1 in order to form multiple memory cells distributed in an array on the semiconductor structure. Each memory cell may include one switch transistor and one capacitor.

In the semiconductor structure provided by the disclosure, only one word line 4 is arranged between two adjacent active bodies 5 in the second direction Y. A turn-on signal may be simultaneously input to two adjacent word lines 4 in order to form a conductive channel on the active part 52 of the active body 5 between the two word lines, therefore, the first source or drain part 51 and the second source or drain part 53 at both ends of the active body 5 are turned on, that is, the switch transistor formed by the active body 5 is turned on. Compared with the related art that one word line is arranged between two adjacent active bodies, the semiconductor structure provided by the disclosure may reduce the space between the two adjacent active bodies in the second direction, therefore, the integration density of the active body 5 of the semiconductor structure is improved, that is, the integration density of the memory cell on the semiconductor structure is improved.

In the exemplary embodiment, as shown in FIG. 2, orthographic projection of the active part 52 on a plane of the word line 4 may be located on the word line 4. Here, the plane of the word line 4 refers to a plane parallel to an extension direction of the word line 4, that is, a plane parallel to a cutting line B-B in FIG. 1. Therefore, a part of the word line 4 may be configured to form the gate of the switch transistor. The bit line 2 may abut the base substrate 1.

In the exemplary embodiment, as shown in FIG. 2, the insulator 3 may include: a first insulator 31, a second insulator 32, and a third insulator 33. The first insulator 31 may be located between each word line 4 and a respective active body 5; the second insulator 32 may be located on one side of each word line 4 facing away from the base substrate 1; and the third insulator 33 may be located between each word line 4 and a respective bit line. A hardness of the second insulator 32 may be greater than hardnesses of the first insulator 31 and the third insulator 33. As shown in FIG. 2, the second insulator 32 is located on an upper surface of the semiconductor structure, the second insulator 32 may protect structures of the bit line, the word line, and the switch transistor inside the semiconductor structure, and the second insulator 32 is formed of the material with high hardness, so that the protection capability of the second insulator 32 may be improved. The first insulator 31 may serve as a gate insulating layer of the switch transistor. The third insulator 33 is configured to electrically isolate the word line and the bit line. In the exemplary embodiment, the material of the first insulator 31 and the third insulator 33 may be silicon oxide, and the material of the second insulator 32 may be silicon nitride.

It is to be understood that in other exemplary embodiments, the first insulator 31, the second insulator 32, and the third insulator 33 may also be formed of other insulating material, for example, the first insulator 31, the second insulator 32, and the third insulator 33 may be formed of one material.

As shown in FIG. 1, the active body 5 is arranged in an array along the first direction X and the second direction Y. When the first direction X is perpendicular to the second direction Y, the active body 5 may be distributed in rows and columns to achieve their maximum integration density. In the exemplary embodiment, the first direction X may be perpendicular to the second direction Y, so that the integration density of the memory cell on the semiconductor structure may be further improved.

In the exemplary embodiment, the material of the bit line and the word line may be metal tungsten. The first source or drain part and the second source or drain part may be doped polysilicon conductors, and a material of the active part is polysilicon. One of the first source or drain part and the second source or drain part is a source of the switch transistor, and the other one is a drain of the switch transistor. It is to be understood that in other exemplary embodiments, the material of the bit line, the word line, the first source or drain part, the second source or drain part, and the active part may also be other material. For example, the bit line and the word line may be metal titanium nitride, copper, silver, and the like. The material of the active part may also be a metal oxide semiconductor, germanium, gallium arsenide, an amorphous silicon semiconductor, and the like, and accordingly, the first source or drain part and the second source or drain part may be formed by doping semiconductor material forming the active part. A doping type may be N-type doping or P-type doping, and a doping ion may be a boron ion, a bismuth ion, a germanium ion, a cobalt ion, a phosphorus ion, and the like. In addition, the active part may also be doped lightly to adjust a resistance value of the active part.

Figure 4:
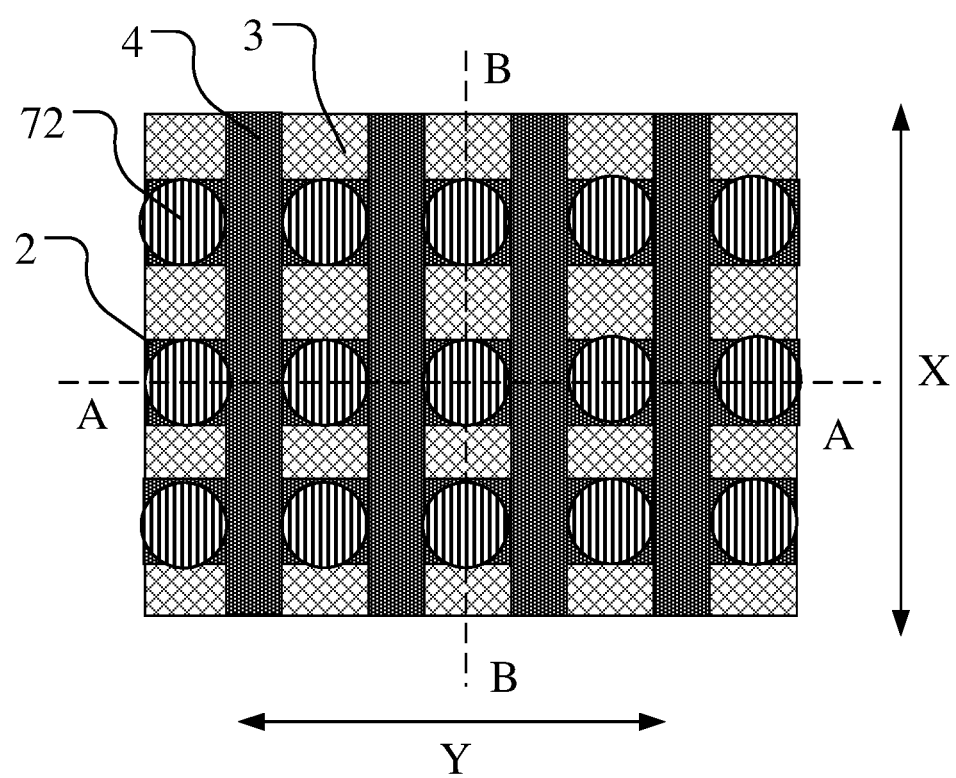
FIG. 4 is a top perspective view of another exemplary embodiment of a semiconductor structure of the disclosure.
Figure 5:
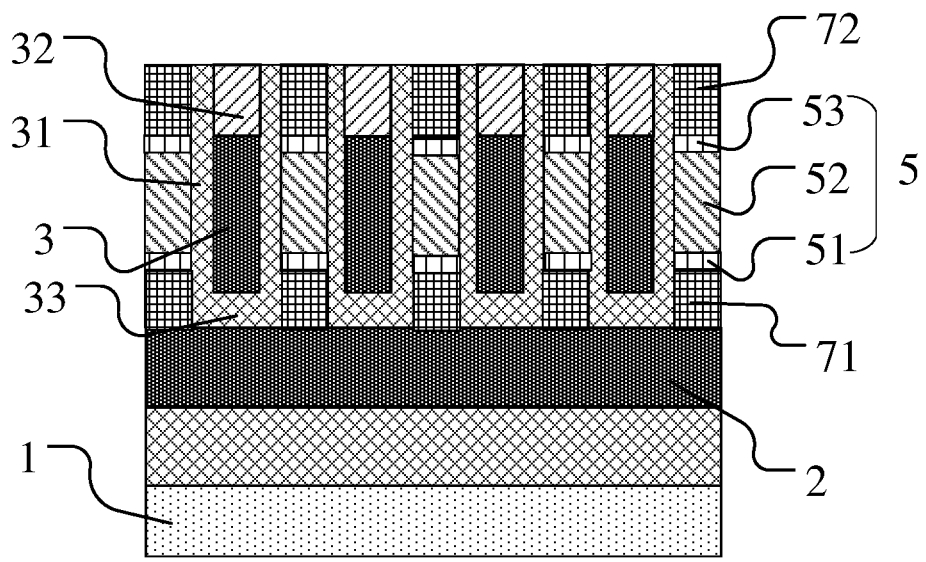
FIG. 5 is a cross-sectional view along a dotted line A-A in FIG. 1.
Figure 6:
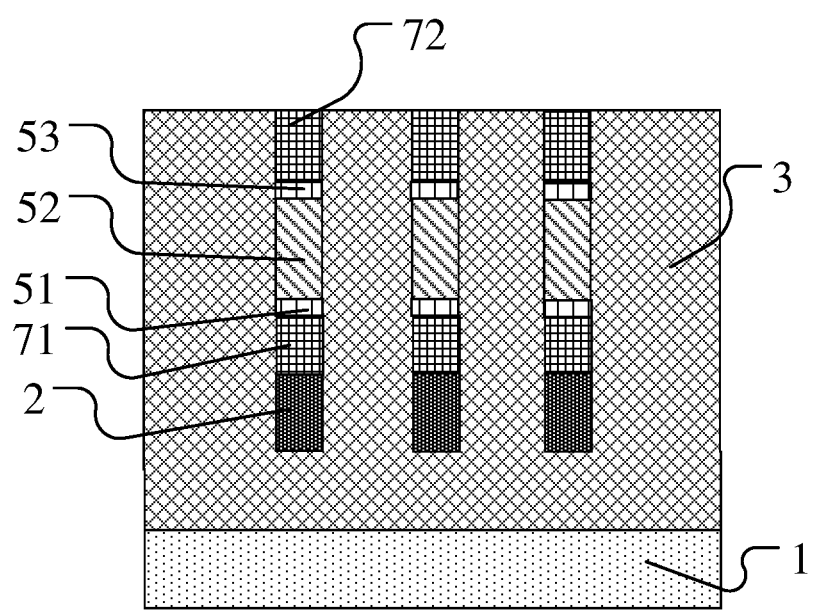
FIG. 6 is a cross-sectional view along a dotted line B-B in FIG. 1.

As shown in FIG. 4, FIG. 5, and FIG. 6, FIG. 4 is a top perspective view of another exemplary embodiment of the semiconductor structure of the disclosure, FIG. 5 is a cross-sectional view along a dotted line A-A in FIG. 1, and FIG. 6 is a cross-sectional view along a dotted line B-B in FIG. 1. Compared with the semiconductor structure shown in FIG. 1, FIG. 2 and FIG. 3, in the exemplary embodiment, each bit line 2 and the base substrate 1 may be arranged to be insulated from one another through a respective part of the insulator 3.

In the exemplary embodiment, a method of forming the first source or drain part 51 and the second source or drain part 53 generally includes that semiconductor material is formed first, and ion doping is performed on both sides of the semiconductor material to form the first source or drain part 51 and the second source or drain part 53. However, during ion doping, the doped ion may have an effect on a dielectric constant of the insulating layer on both sides of the semiconductor material. For example, as shown in FIG. 2, the doped ion may increase the dielectric constant of the insulator 3. In the exemplary embodiment, as shown in FIG. 4 and FIG. 5, the semiconductor structure may further include a first conductor part 71 and a second conductor part 72. The first conductor part 71 may be located between each bit line 2 and the first source or drain part 51; and the second conductor part 72 may be located on one side of the second source or drain part 53 facing away from the base substrate 1. As shown in FIG. 5, the arrangement may reduce the size of the first source or drain part 51 and the second source or drain part 53 in a laminating direction, so that the ion doping range of the insulator may be reduced. The first conductor part 71 may serve as a bit line contact plug and the second conductor part 72 may serve as a capacitor contact plug.

The exemplary embodiments further provide a manufacturing method of a semiconductor structure. The method may form the above semiconductor structure. The method may include the following operations.

In S1, a to-be-etched body is formed. The to-be-etched body includes a base substrate, an insulator located on one side of the base substrate and multiple bit lines. The bit lines are located in the insulator, and the multiple bit lines are distributed at intervals along a first direction and extend along a second direction.

In S2, multiple second grooves which are distributed at intervals along the second direction and extend along the first direction are formed on one side of the insulator facing away from the bit lines.

In S3, a word line and a fourth insulating layer are sequentially formed in each second groove. The fourth insulating layer is located on one side of the word line facing away from a bottom of the second groove.

In S4, multiple through holes distributed in an array are formed on one side of the insulator facing away from the base substrate. Orthographic projection of each through hole on the base substrate at least partially coincides with the orthographic projection of a respective bit line on the base substrate. The through hole extends to a surface of one side of the bit line facing the through hole. The orthographic projection of each through hole on the base substrate is located between the orthographic projections of two adjacent word lines on the base substrate. In the second direction, the orthographic projection of only one word line on the base substrate is located between the orthographic projections of two adjacent through holes on the base substrate.

In S5, a fifth insulating layer is formed on one side of the word line exposed to the through hole.

In S6, a first source or drain part, an active part and a second source or drain part are formed in each through hole. The first source or drain part is located on one side of the bit line, the active part is located on one side of the first source or drain part facing away from the bit line, and the second source or drain part is located on one side of the active part facing away from the bit line.

The operation that a to-be-etched body is formed may include the following operations.

In S11, a substrate material layer is formed. Multiple first grooves, which are distributed at intervals along the first direction and extend along the second direction, are formed on one side surface of the substrate material layer.

In S12, a first insulating layer, a bit line and a second insulating layer are formed in the first groove. The bit line is located on one side of the first insulating layer facing away from a bottom of the first groove. The second insulating layer is located on one side of the bit line facing away from the bottom of the first groove.

In S13, the substrate material layer on one side, facing an opening of the first groove, of a plane of the bottom of the first groove is removed so as to form the remaining substrate material layer into the base substrate, and a third insulating layer is filled at a position of a removed substrate material layer so as to form the third insulating layer, the first insulating layer and the second insulating layer into the insulator.

The above steps are described in detail below.

Figure 7:
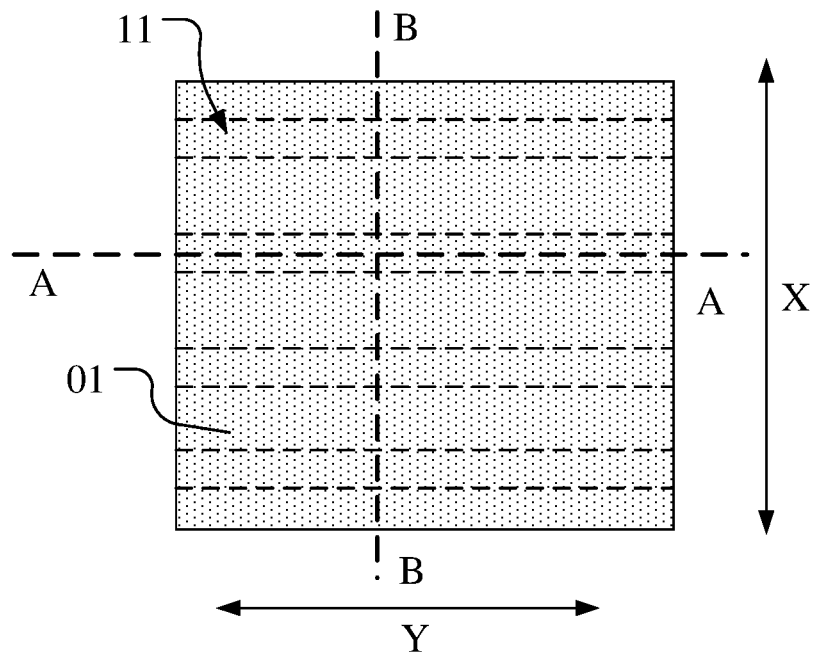
FIG. 7 is a top view of a semiconductor structure semi-finished product in one exemplary embodiment of a manufacturing method of a semiconductor structure of the disclosure.
Figure 8:
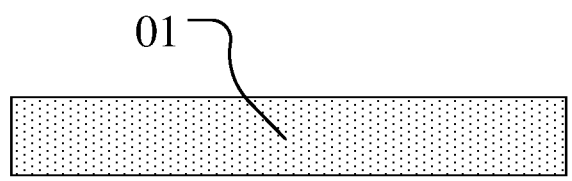
FIG. 8 is a cross-sectional view of a dotted line A-A in FIG. 7.
Figure 9:
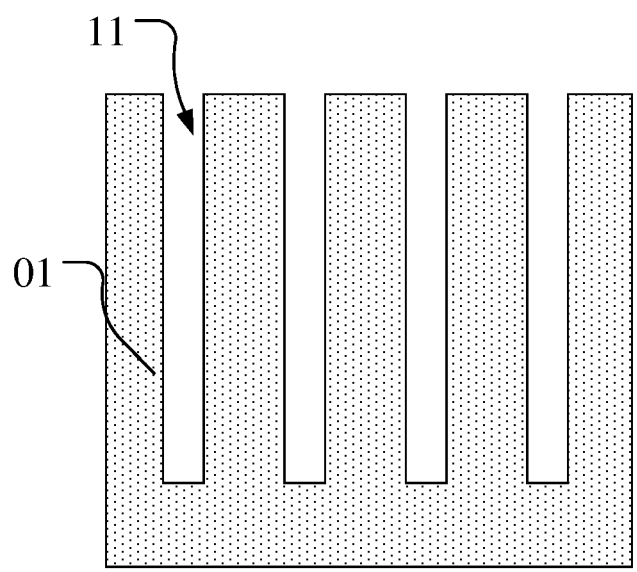
FIG. 9 is a cross-sectional view of a dotted line B-B in FIG. 7.

As shown in FIG. 7, FIG. 8, and FIG. 9, FIG. 7 is a top view of a semiconductor structure semi-finished product in one exemplary embodiment of a manufacturing method of a semiconductor structure of the disclosure. FIG. 8 is a cross-sectional view of a dotted line A-A in FIG. 7. FIG. 9 is a cross-sectional view of a dotted line B-B in FIG. 7. In S11, a substrate material layer 01 is formed. Multiple first grooves 11, which are distributed at intervals along the first direction and extend along the second direction, are formed on one side surface of the substrate material layer 01. The material of the substrate material layer 01 may be other material, for example, silicon, Silicon-on-Insulator (SOI), germanium, gallium arsenide, and the like. Multiple first grooves 11 which are distributed at intervals along the first direction X and extend along the second direction Y are formed on one side of the substrate material layer 01.

As shown in FIG. 10 to FIG. 27, FIG. 10, FIG. 13, FIG. 16, FIG. 19, FIG. 22, and FIG. 25 are top views of a semiconductor structure semi-finished product in one exemplary embodiment of a manufacturing method of a semiconductor structure of the disclosure. FIG. 11 is a cross-sectional view of a dotted line A-A in FIG. 10; FIG. 12 is a cross-sectional view of a dotted line B-B in FIG. 10; FIG. 14 is a cross-sectional view of a dotted line A-A in FIG. 13; FIG. 15 is a cross-sectional view of a dotted line B-B in FIG. 13; FIG. 17 is a cross-sectional view of a dotted line A-A in FIG. 16; FIG. 18 is a cross-sectional view of a dotted line B-B in FIG. 16; FIG. 20 is a cross-sectional view of a dotted line A-A in FIG. 19; FIG. 21 is a cross-sectional view of a dotted line B-B in FIG. 19; FIG. 23 is a cross-sectional view of a dotted line A-A in FIG. 22; FIG. 24 is a cross-sectional view of a dotted line B-B in FIG. 22; FIG. 26 is a cross-sectional view of a dotted line A-A in FIG. 25; and FIG. 27 is a cross-sectional view of a dotted line B-B in FIG. 25. In S12, a first insulating layer, a bit line and a second insulating layer are formed in the first groove 11. The bit line is located on one side of the first insulating layer facing away from a bottom of the first groove. The second insulating layer is located on one side of the first insulating layer facing away from a bottom of the first groove. The following operations may be included.

Figure 10:
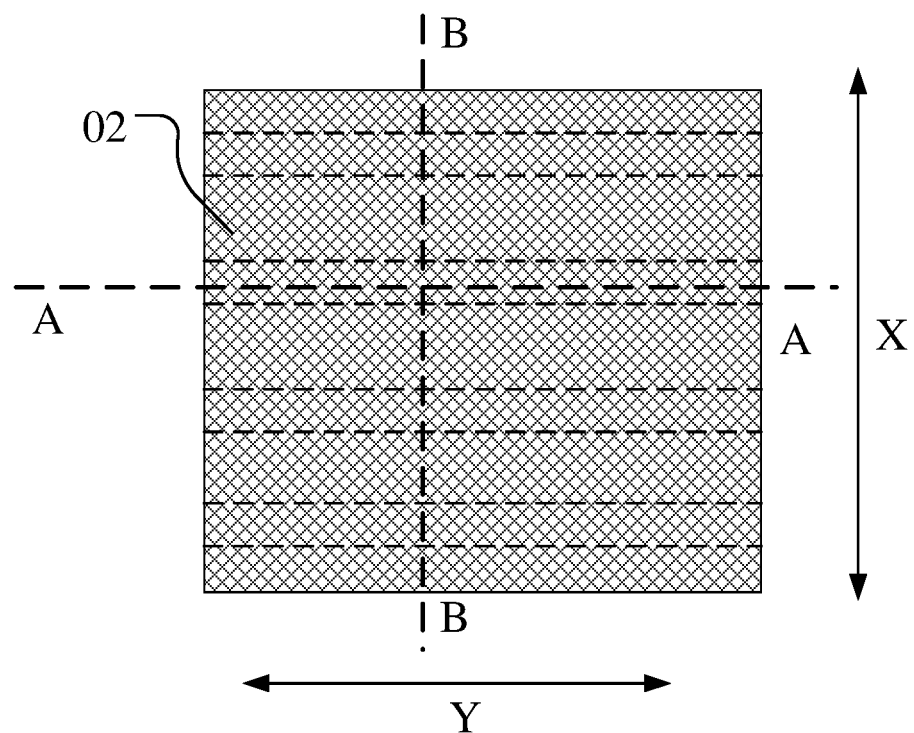
FIG. 10, FIG. 13, FIG. 16, FIG. 19, FIG. 22, and FIG. 25 are top views of a semiconductor structure semi-finished product in one exemplary embodiment of a manufacturing method of a semiconductor structure of the disclosure.
Figure 11:
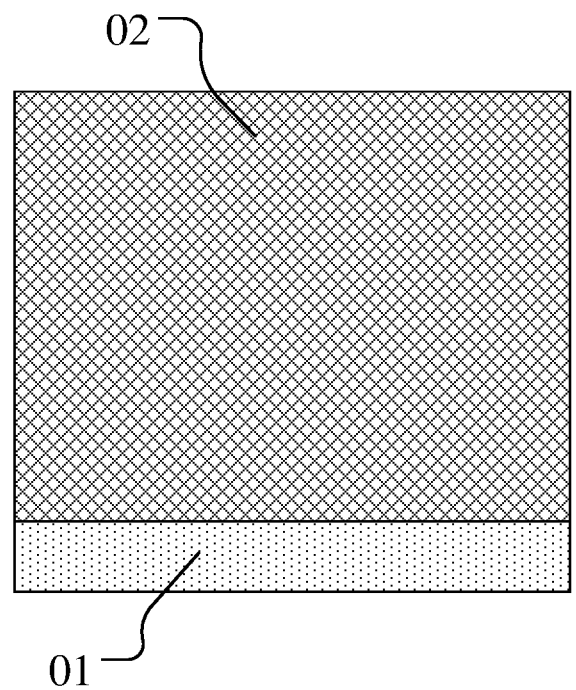
FIG. 11 is a cross-sectional view of a dotted line A-A in FIG. 10.
Figure 12:
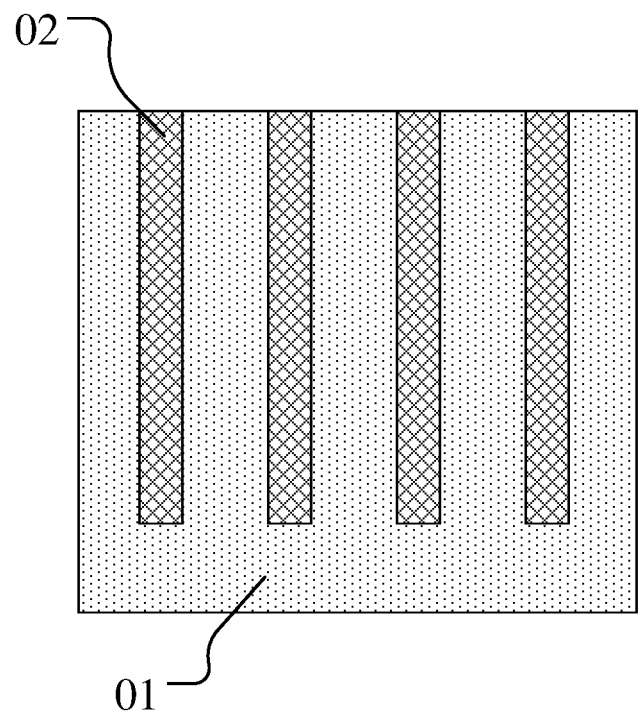
FIG. 12 is a cross-sectional view of a dotted line B-B in FIG. 10.

As shown in FIG. 10, FIG. 11, and FIG. 12, a first insulating material layer 02 may first be deposited through a deposition process on one side, provided with the first groove 11, of the substrate material layer 01 to fill the first groove 11. The material of the first insulating material layer 02 may be silicon oxide.

Figure 13:
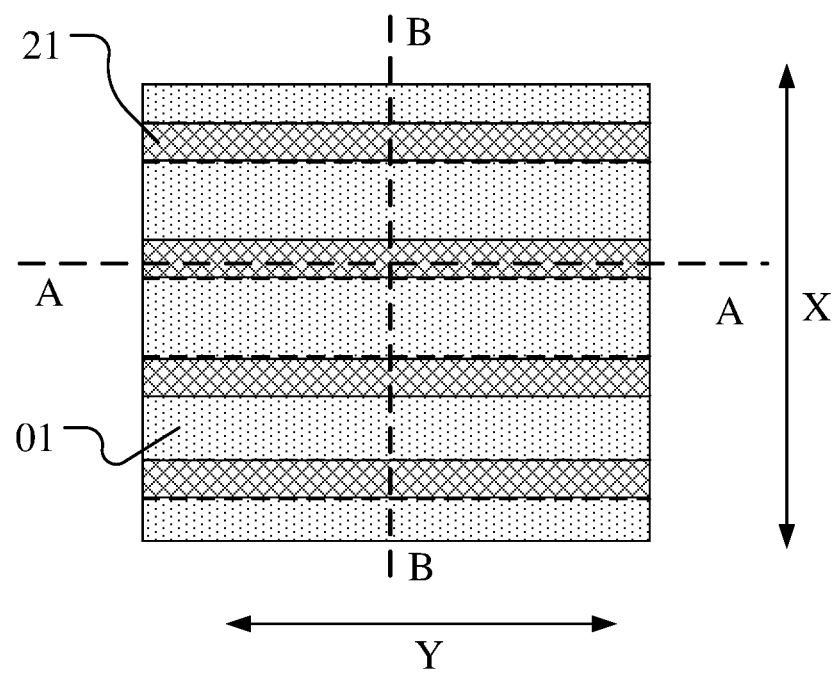
Figure 14:
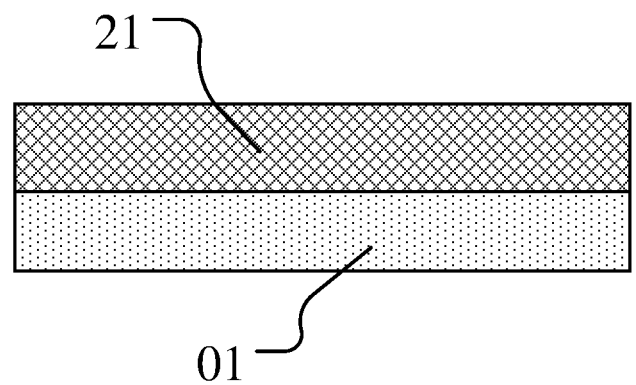
FIG. 14 is a cross-sectional view of a dotted line A-A in FIG. 13.
Figure 15:
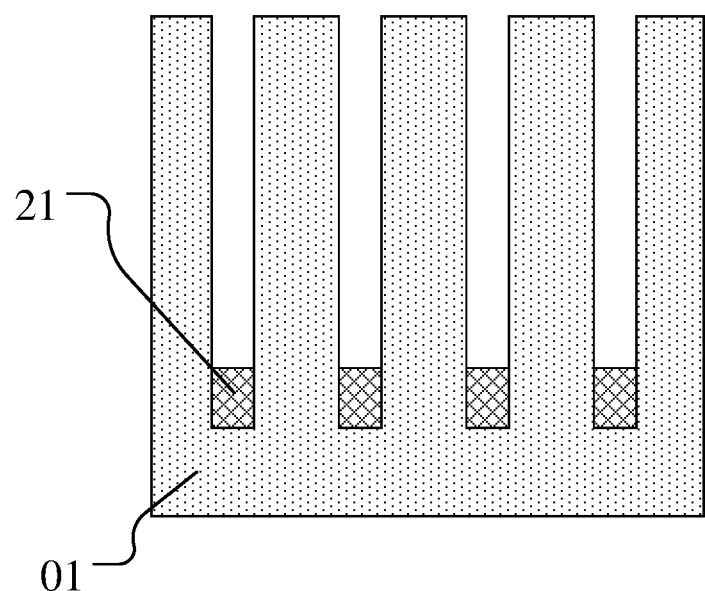
FIG. 15 is a cross-sectional view of a dotted line B-B in FIG. 13.

As shown in FIG. 13, FIG. 14, and FIG. 15, the first insulating material layer 02 in the first groove 11 may then be partially etched through an etching process to form the first insulating layer 21 in the first groove 11. An upper surface of the first insulating layer 21 is lower than the upper surface of the first groove 11.

Figure 16:
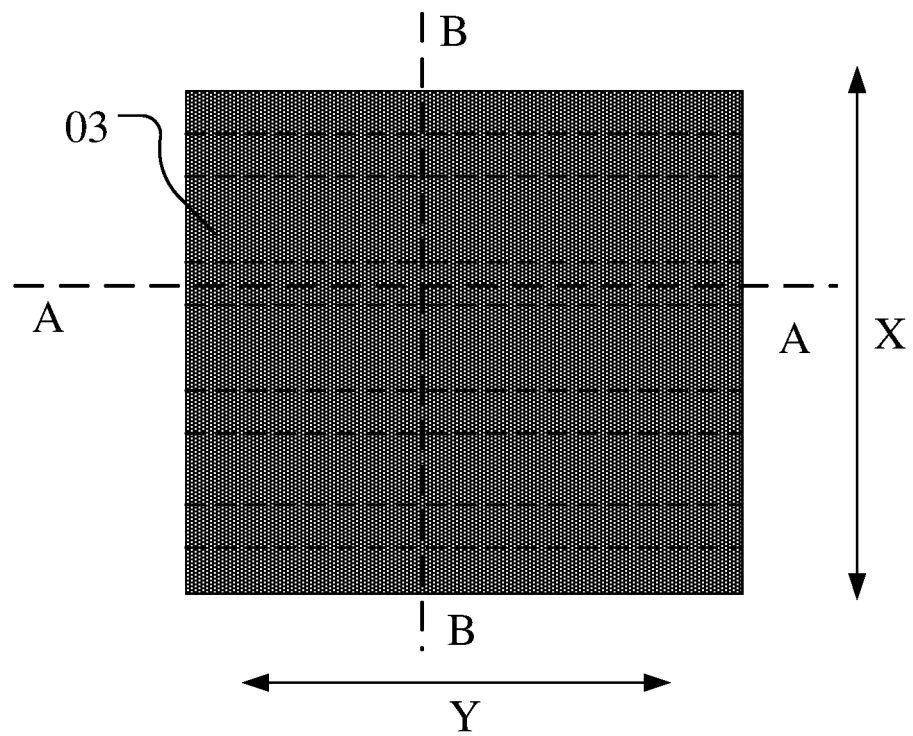
Figure 17:
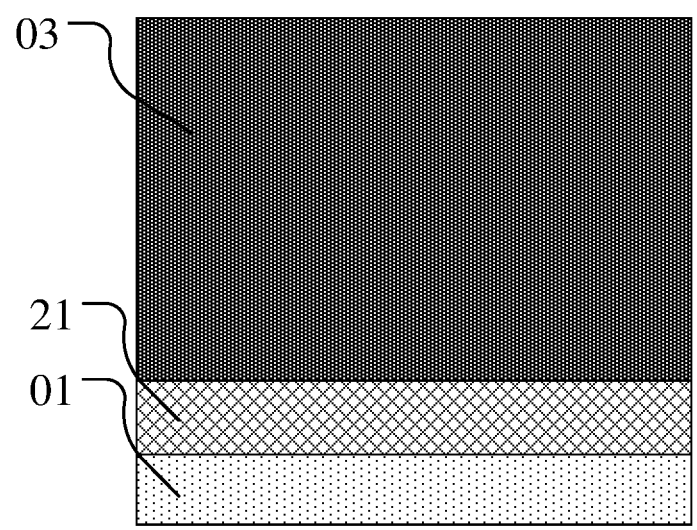
FIG. 17 is a cross-sectional view of a dotted line A-A in FIG. 16.
Figure 18:
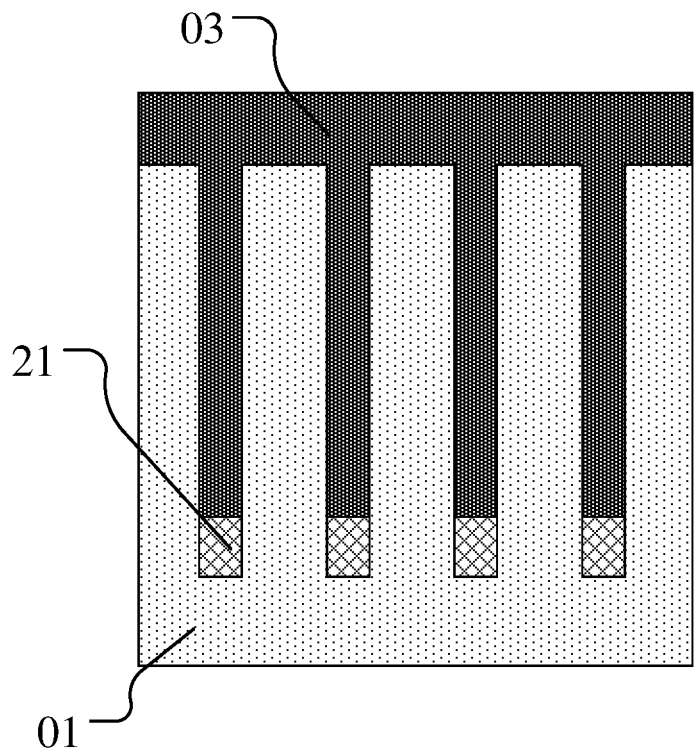
FIG. 18 is a cross-sectional view of a dotted line B-B in FIG. 16.

As shown in FIG. 16, FIG. 17, and FIG. 18, a bit line material layer 03 may then be coated through the deposition process on one side, provided with the first groove 11, of the substrate material layer 01 to fill the first groove 11. The material of the bit line material layer 03 may be metal tungsten.

Figure 19:
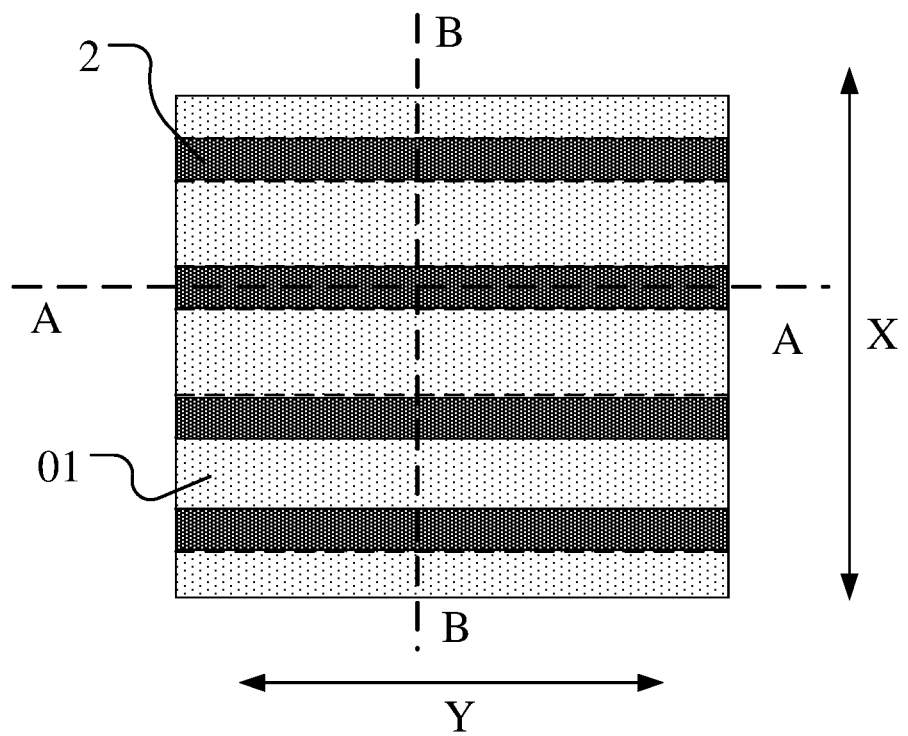
Figure 20:
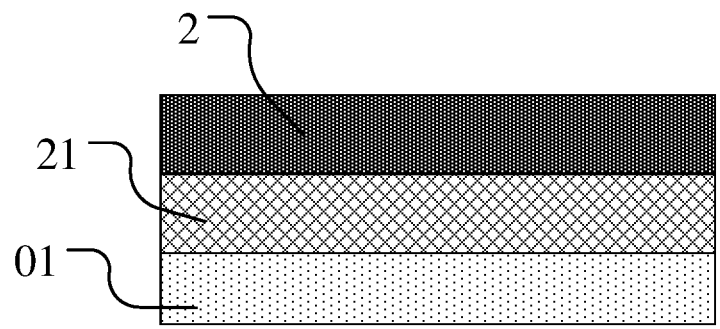
FIG. 20 is a cross-sectional view of a dotted line A-A in FIG. 19.
Figure 21:
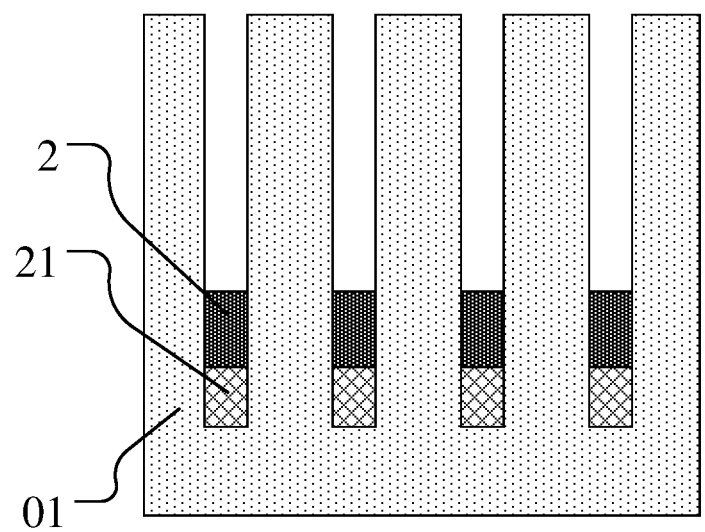
FIG. 21 is a cross-sectional view of a dotted line B-B in FIG. 19.

As shown in FIG. 19, FIG. 20, and FIG. 21, the bit line material layer 03 in the first groove 11 may then be partially etched through the etching process to form the bit line 2 in the first groove 11. The upper surface of the bit line 2 is lower than the upper surface of the first groove 11.

Figure 22:
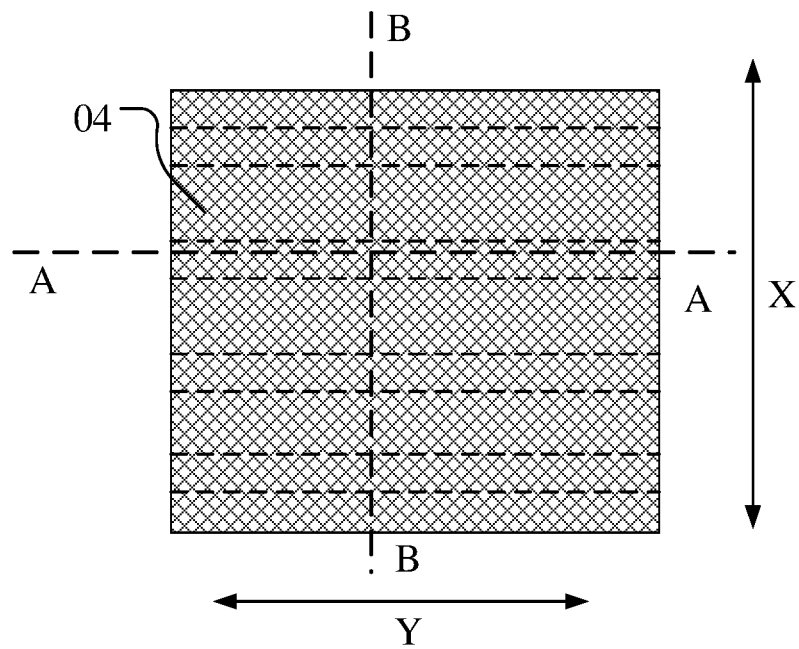
Figure 23:
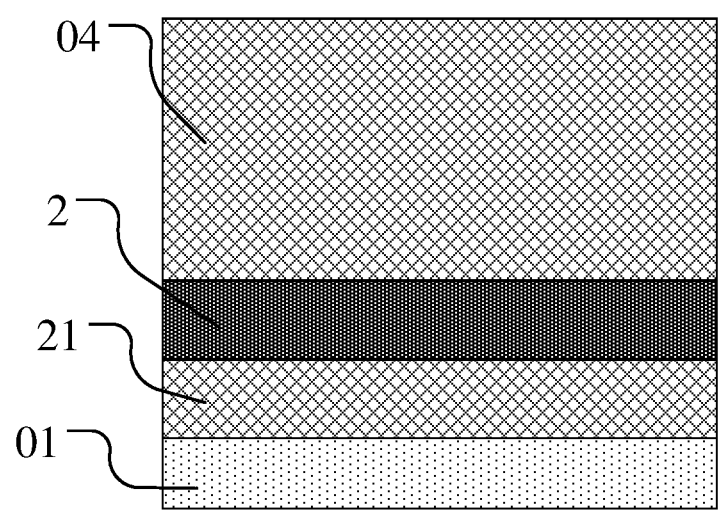
FIG. 23 is a cross-sectional view of a dotted line A-A in FIG. 22.
Figure 24:
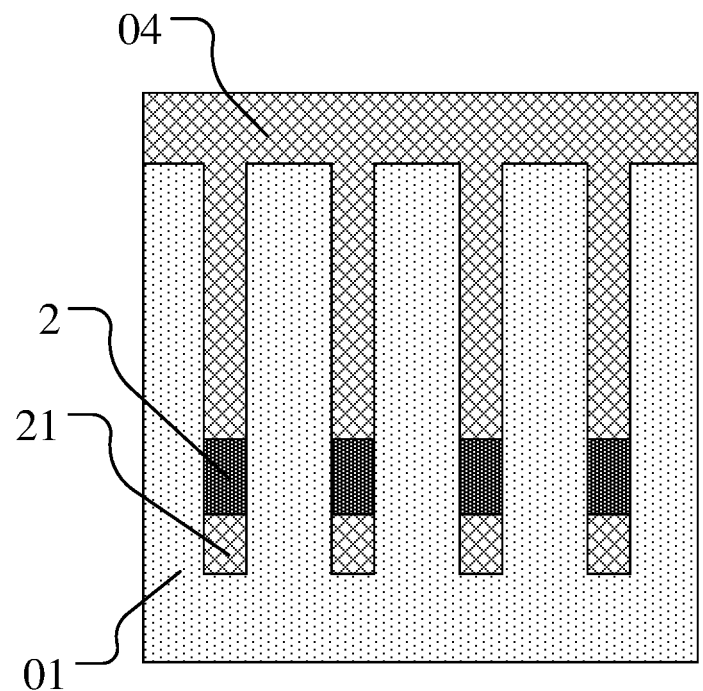
FIG. 24 is a cross-sectional view of a dotted line B-B in FIG. 22.

As shown in FIG. 22, FIG. 23 and FIG. 24, a second insulating material layer 04 may first be deposited through the deposition process on one side, provided with the first groove 11, of the substrate material layer 01 to fill the first groove 11. The material of the second insulating material layer 04 may be silicon oxide.

Figure 25:
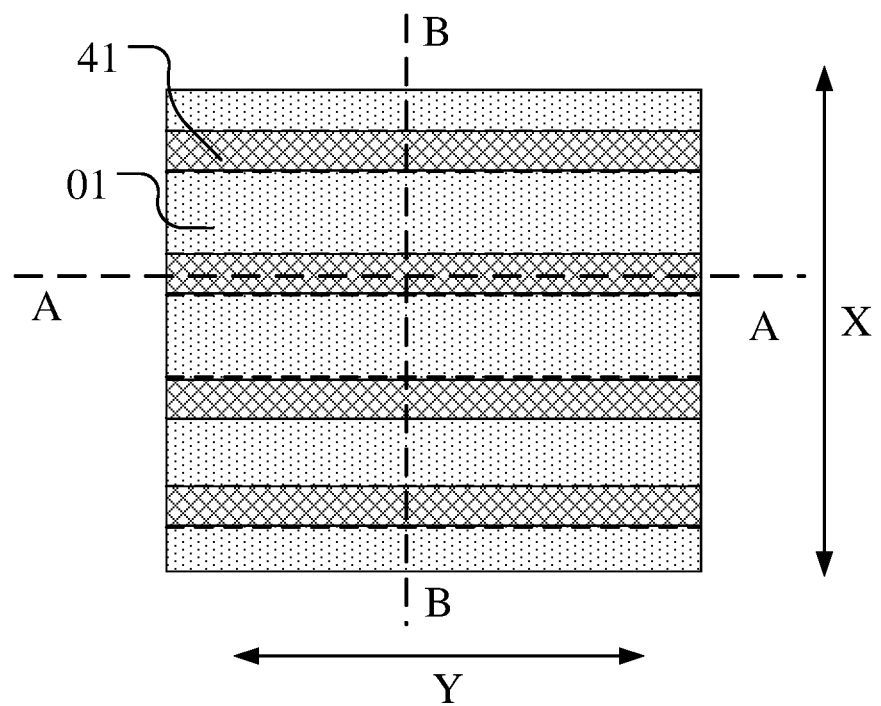
Figure 26:
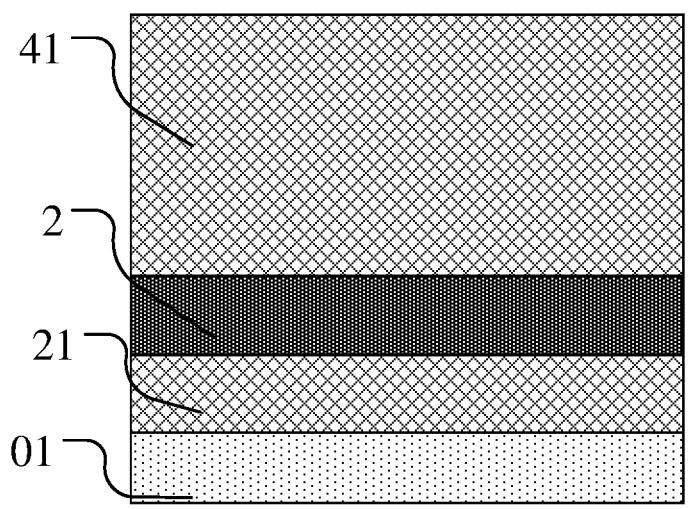
FIG. 26 is a cross-sectional view of a dotted line A-A in FIG. 25.
Figure 27:
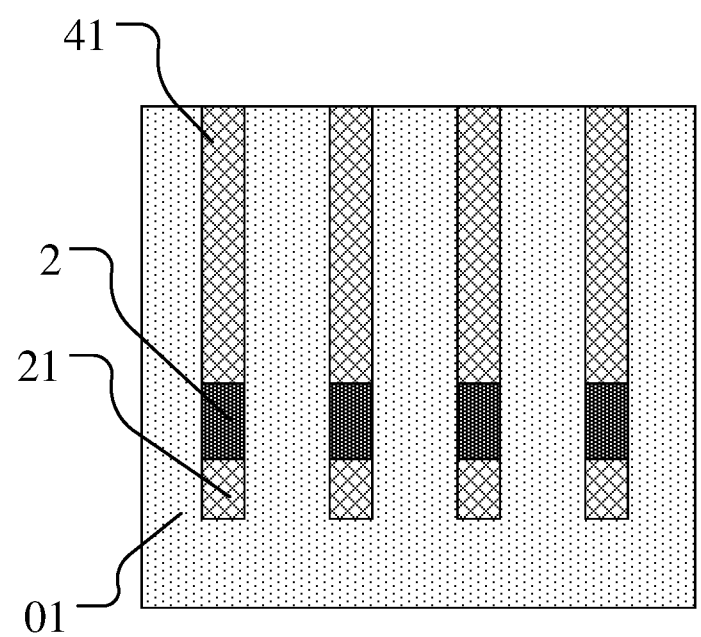
FIG. 27 is a cross-sectional view of a dotted line B-B in FIG. 25.

As shown in FIG. 25, FIG. 26, and FIG. 27, Chemical Mechanical Polishing (CMP) may then be performed on one side, provided with the first groove 11, of the substrate material layer 01, so that the upper surface of the second insulating material layer 04 is flush with the upper surface of the first groove 11, thereby forming the second insulating material layer 04 into the second insulating layer 41.

Figure 28:
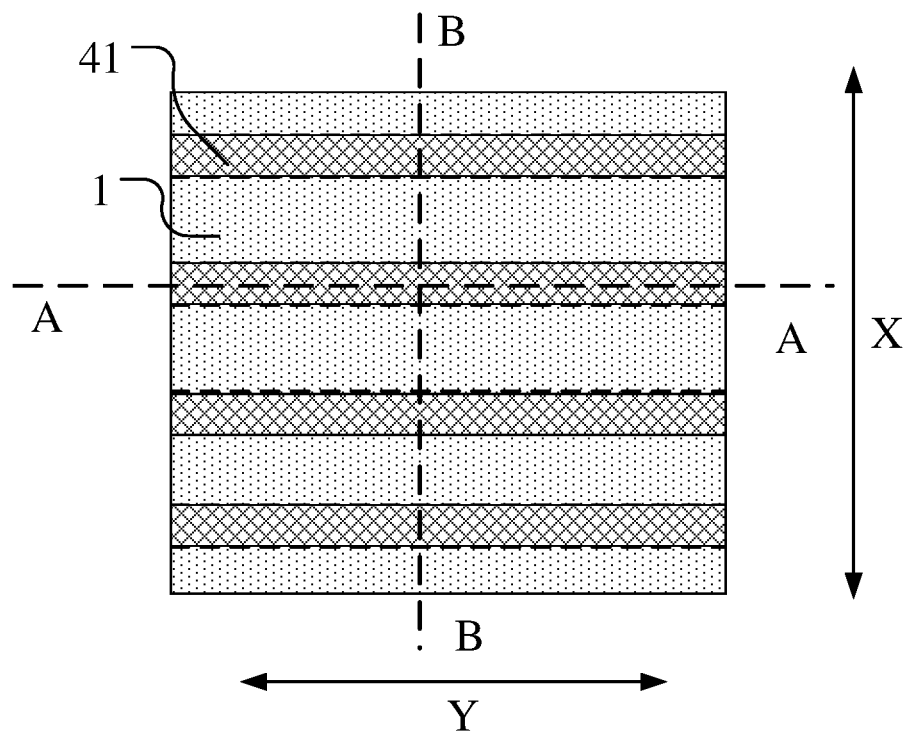
FIG. 28 and FIG. 31 are top views of a semiconductor structure semi-finished product in one exemplary embodiment of a manufacturing method of a semiconductor structure of the disclosure.
Figure 29:
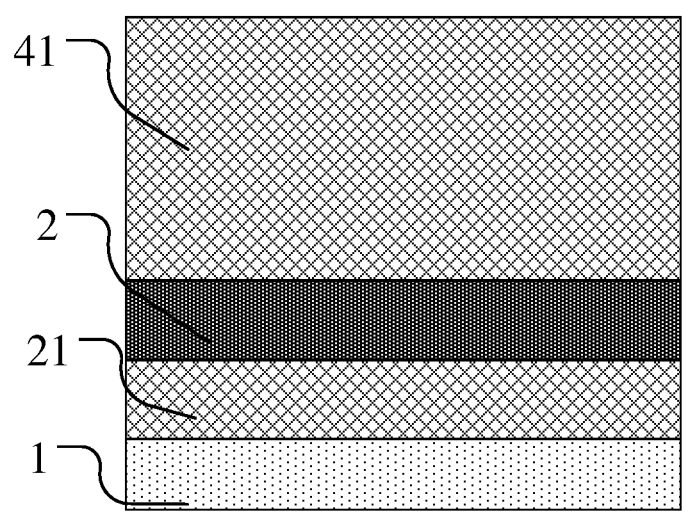
FIG. 29 is a cross-sectional view of a dotted line A-A in FIG. 28.
Figure 30:
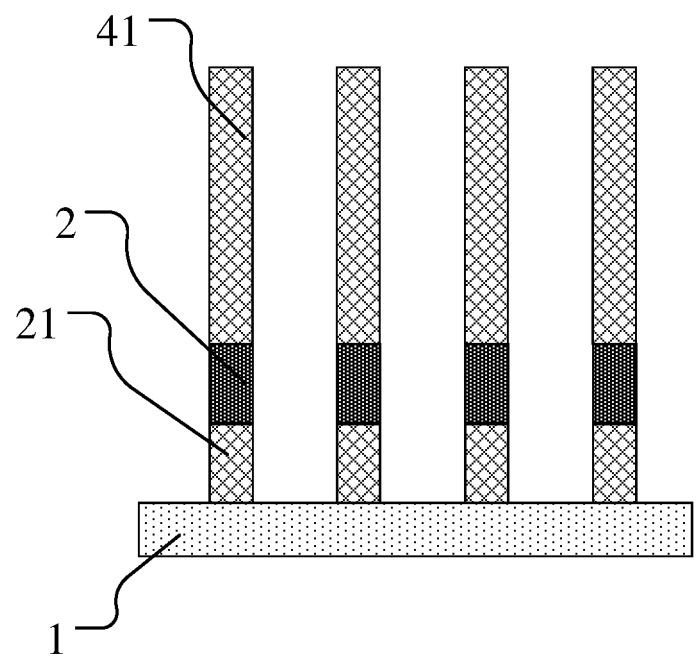
FIG. 30 is a cross-sectional view of a dotted line B-B in FIG. 28.
Figure 31:
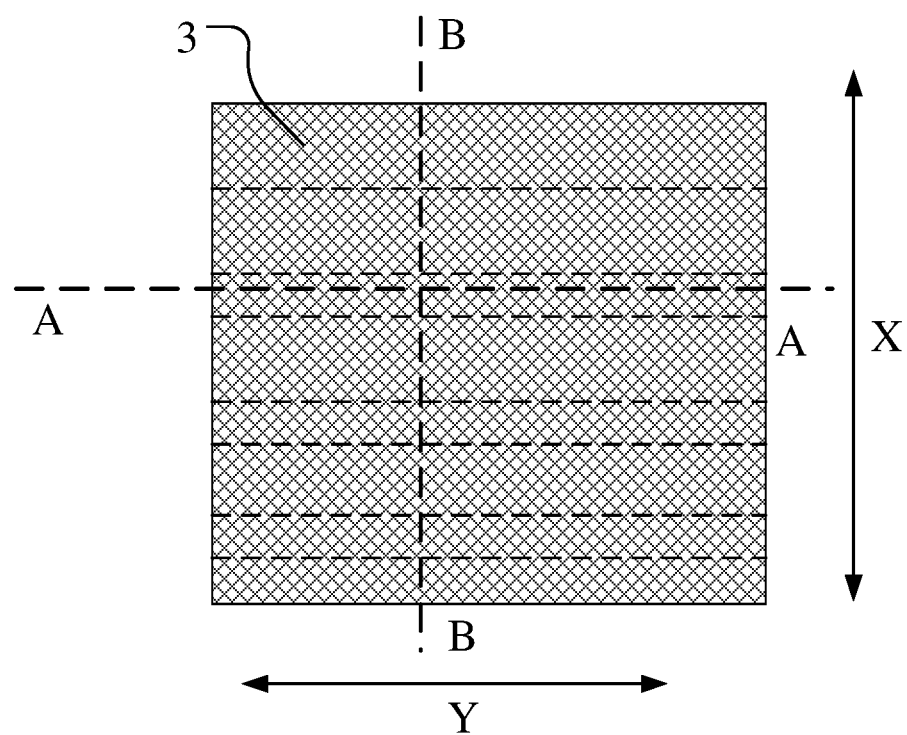
Figure 32:
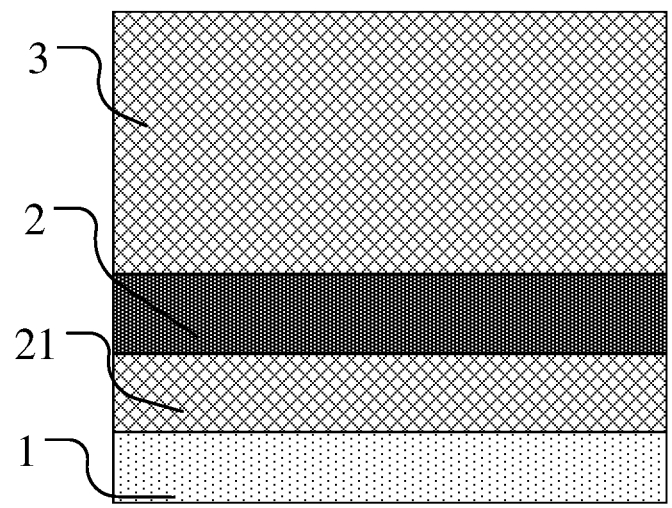
FIG. 32 is a cross-sectional view of a dotted line A-A in FIG. 31.
Figure 33:
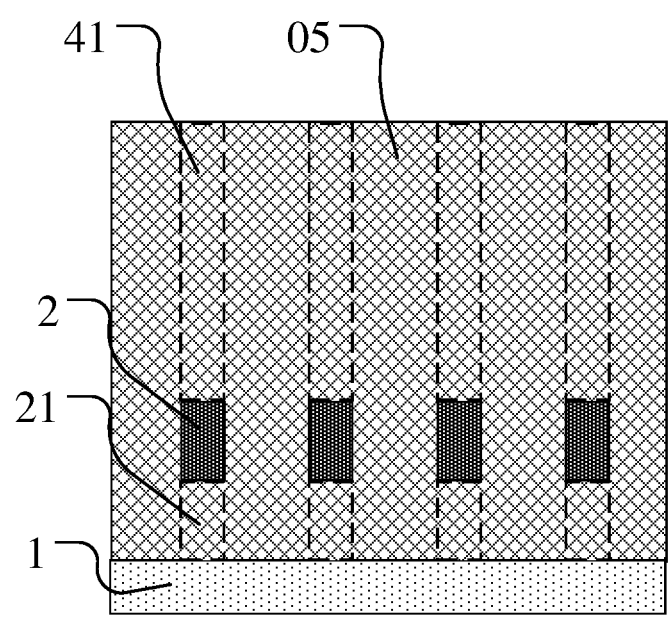
FIG. 33 is a cross-sectional view of a dotted line B-B in FIG. 31.

As shown in FIG. 28 to FIG. 33, FIG. 28, and FIG. 31 are top views of a semiconductor structure semi-finished product in one exemplary embodiment of a manufacturing method of a semiconductor structure of the disclosure. FIG. 29 is a cross-sectional view of a dotted line A-A in FIG. 28; FIG. 30 is a cross-sectional view of a dotted line B-B in FIG. 28; FIG. 32 is a cross-sectional view of a dotted line A-A in FIG. 31; and FIG. 33 is a cross-sectional view of a dotted line B-B in FIG. 31. As shown in FIG. 28, FIG. 29, and FIG. 30, first, S13 may include that: the substrate material layer on one side, facing an opening of the first groove, of a plane of the bottom of the first groove is removed through the etching process so as to form the remaining substrate material layer into the base substrate 1. As shown in FIG. 31, FIG. 32 and FIG. 33, then S13 may further includes that: the third insulating layer 05 is filled at a position of a removed substrate material layer through the deposition process to form the third insulating layer 05, the first insulating layer 21, and the second insulating layer 41 into the insulator 3.

Figure 34:
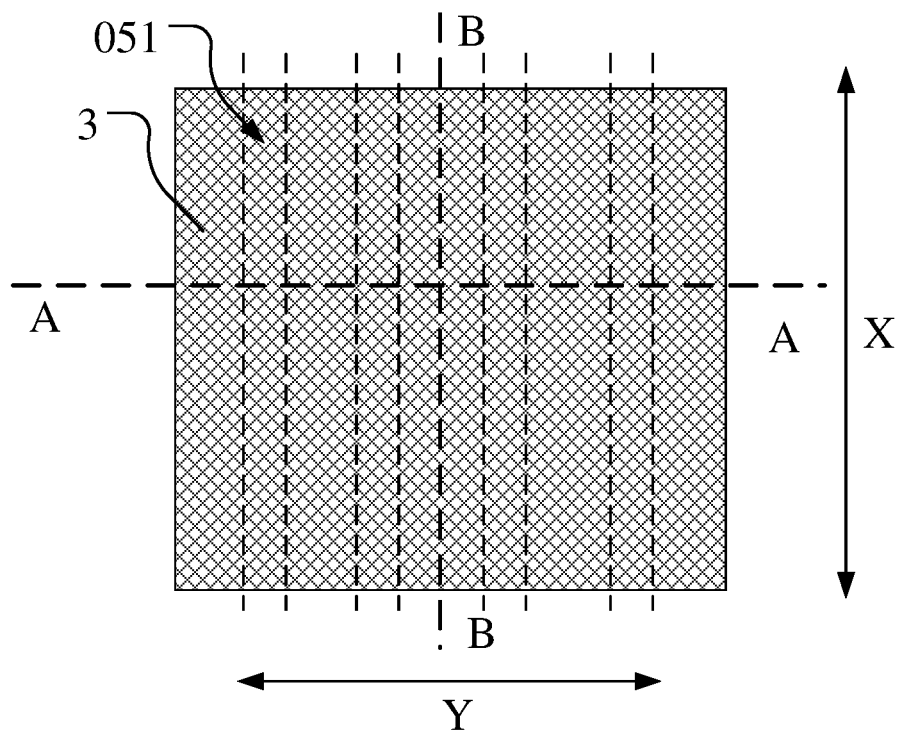
FIG. 34 is a top view of a semiconductor structure semi-finished product in one exemplary embodiment of a manufacturing method of a semiconductor structure of the disclosure.
Figure 35:
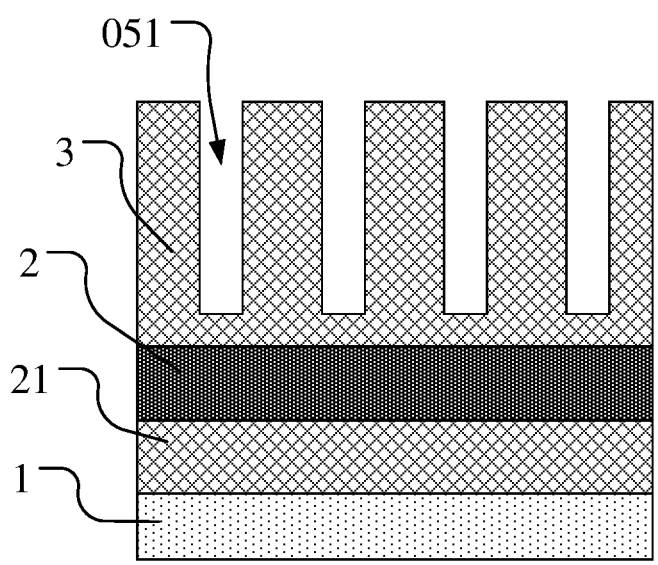
FIG. 35 is a cross-sectional view of a dotted line A-A in FIG. 34.
Figure 36:
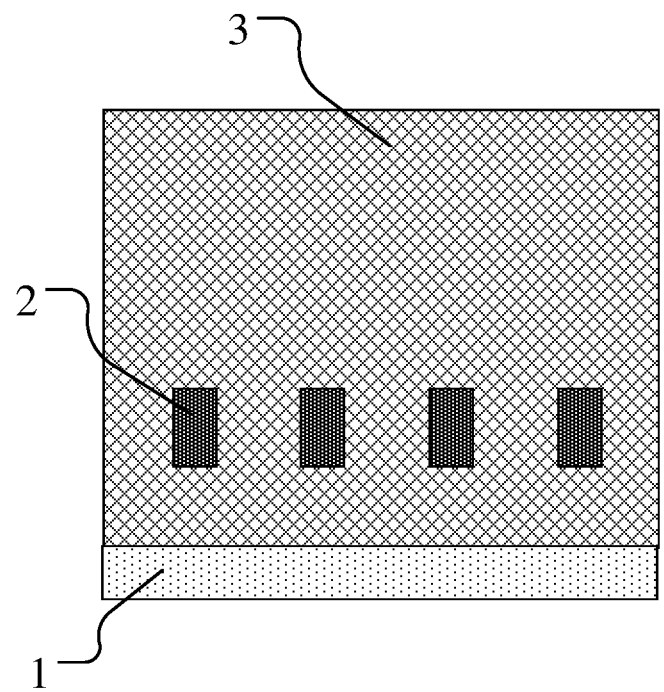
FIG. 36 is a cross-sectional view of a dotted line B-B in FIG. 34.

As shown in FIG. 34 to FIG. 36, FIG. 34 is a top view of a semiconductor structure semi-finished product in one exemplary embodiment of a manufacturing method of a semiconductor structure of the disclosure; FIG. 35 is a cross-sectional view of a dotted line A-A in FIG. 34; and FIG. 36 is a cross-sectional view of a dotted line B-B in FIG. 34. In S2, multiple second grooves 051 which are distributed at intervals along the second direction Y and extend along the first direction X may be formed through the etching process on one side of the insulator 3 facing way from the bit lines 2.

Figure 37:
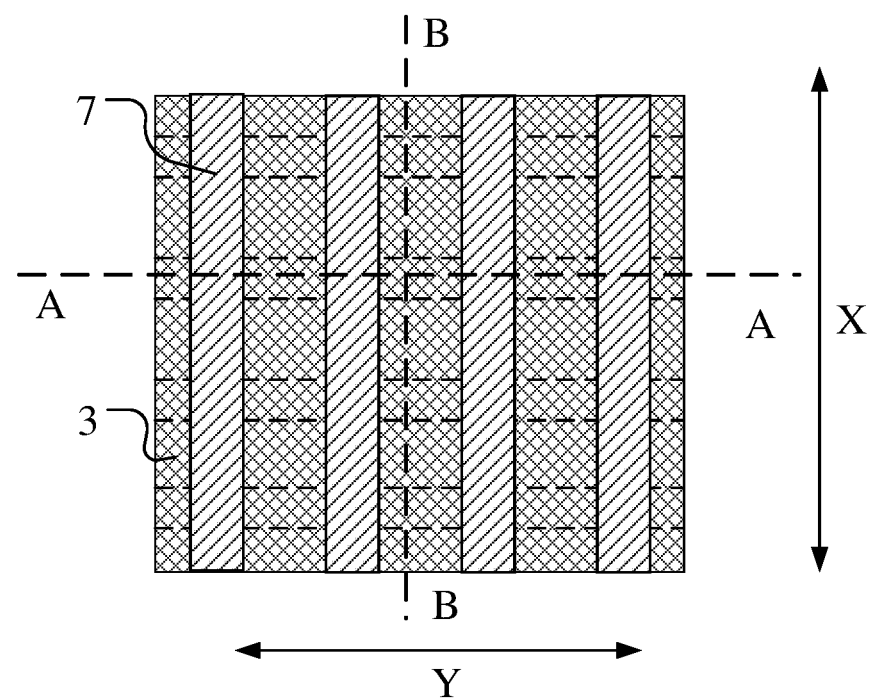
FIG. 37 is a top view of a semiconductor structure semi-finished product in one exemplary embodiment of a manufacturing method of a semiconductor structure of the disclosure.
Figure 38:
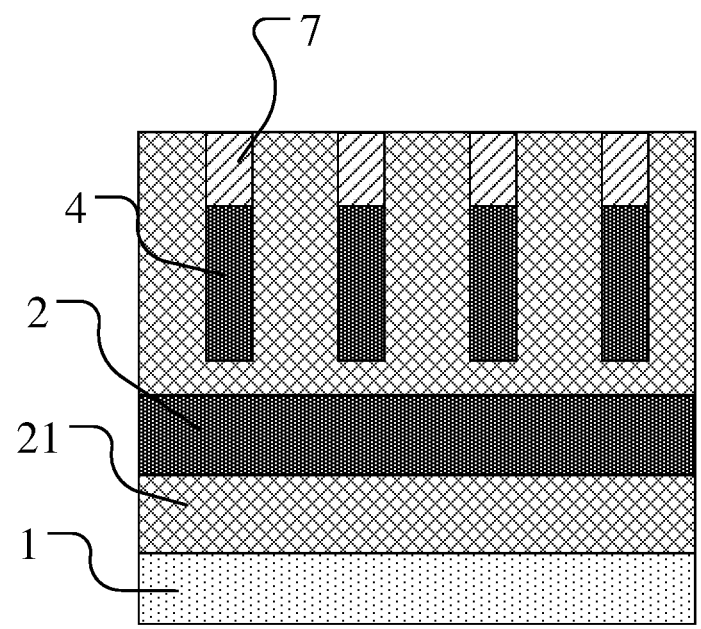
FIG. 38 is a cross-sectional view of a dotted line A-A in FIG. 37.
Figure 39:
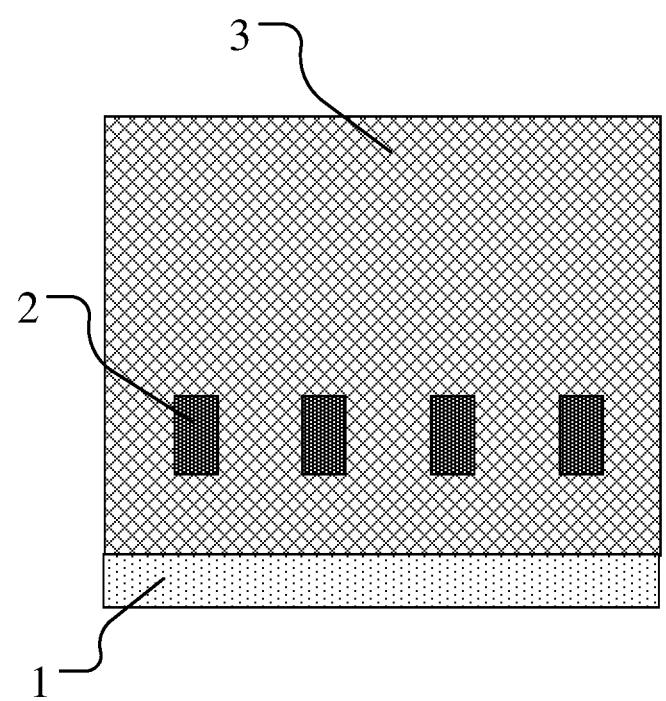
FIG. 39 is a cross-sectional view of a dotted line B-B in FIG. 37.

As shown in FIG. 37 to FIG. 39, FIG. 37 is a top view of a semiconductor structure semi-finished product in one exemplary embodiment of a manufacturing method of a semiconductor structure of the disclosure; FIG. 38 is a cross-sectional view of a dotted line A-A in FIG. 37; and FIG. 39 is a cross-sectional view of a dotted line B-B in FIG. 37. In S3, the word line 4 and a fourth insulating layer 7 may be sequentially formed in each second groove 051 through the deposition and etching processes. The fourth insulating layer 7 is located on one side of the word line 4 facing away from the bottom of the second groove 051.

Figure 40:
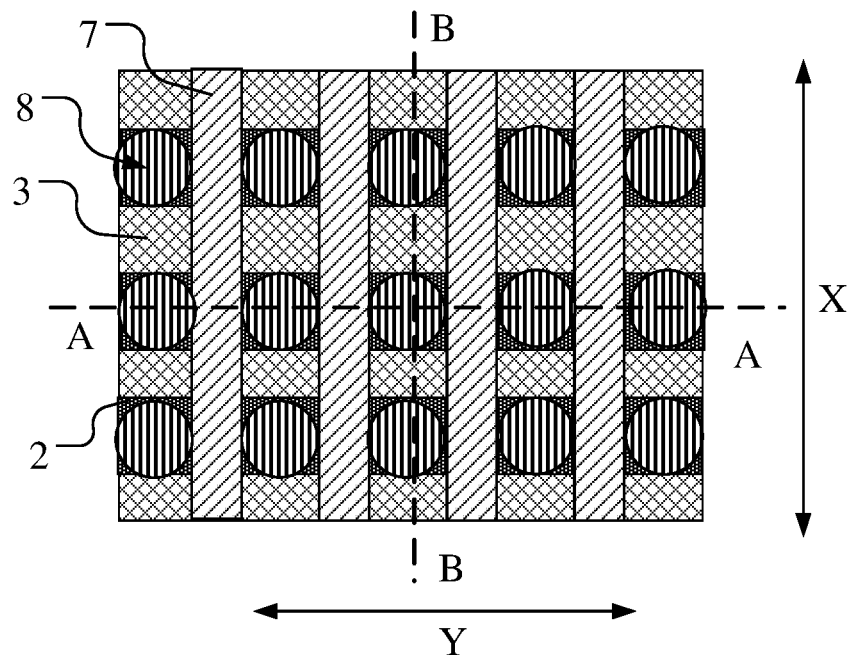
FIG. 40 is a top perspective view of a semiconductor structure semi-finished product in one exemplary embodiment of a manufacturing method of a semiconductor structure of the disclosure.
Figure 41:
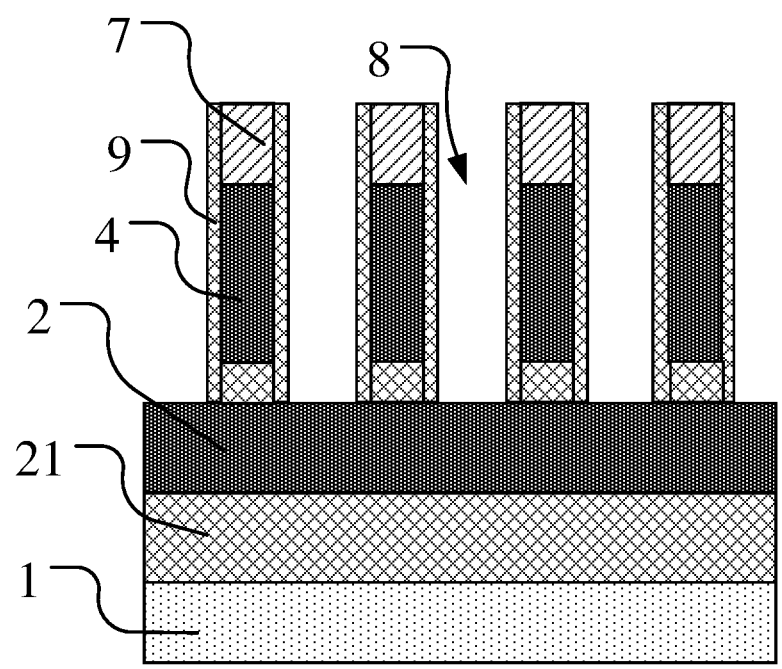
FIG. 41 is a cross-sectional view of a dotted line A-A in FIG. 40.
Figure 42:
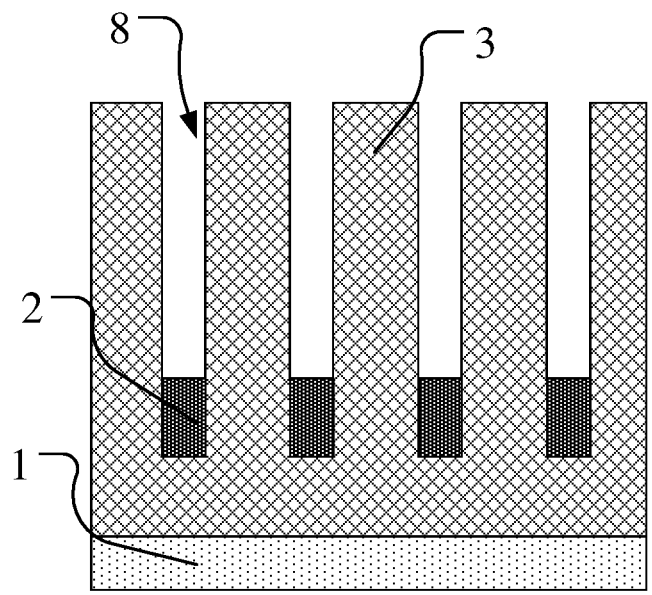
FIG. 42 is a cross-sectional view of a dotted line B-B in FIG. 40.

As shown in FIG. 40 to FIG. 42, FIG. 40 is a top perspective view of a semiconductor structure semi-finished product in one exemplary embodiment of a manufacturing method of a semiconductor structure of the disclosure; FIG. 41 is a cross-sectional view of a dotted line A-A in FIG. 40; and FIG. 42 is a cross-sectional view of a dotted line B-B in FIG. 40. In S4, multiple through holes 8 distributed in an array may be formed on the insulator 3 through the etching process. Orthographic projection of each through hole 8 on the base substrate 1 at least partially coincides with the orthographic projection of a respective bit line 2 on the base substrate 1. The through hole 8 extends to a surface of one side, facing the through hole 8, of the bit line 2. The orthographic projection of each through hole 8 on the base substrate 1 is located between the orthographic projections of two adjacent word lines 4 on the base substrate 1. Furthermore, in the second direction Y, the orthographic projection of only one word line 4 on the base substrate 1 is located between the orthographic projections of two adjacent through holes 8 on the base substrate 1.

In S5, a fifth insulating layer 9 may be formed through an atomic layer deposition process on one side of the word line 4 exposed to the through hole 8. The fifth insulating layer 9 may be used for a gate oxide layer of the word line 4. Specifically, an insulating layer may be deposited on the through hole through the atomic layer deposition process, the insulating layer at the bottom of the through hole is etched, and the insulating layer on a sidewall of the through hole is reserved to form the fifth insulating layer.

Figure 43:
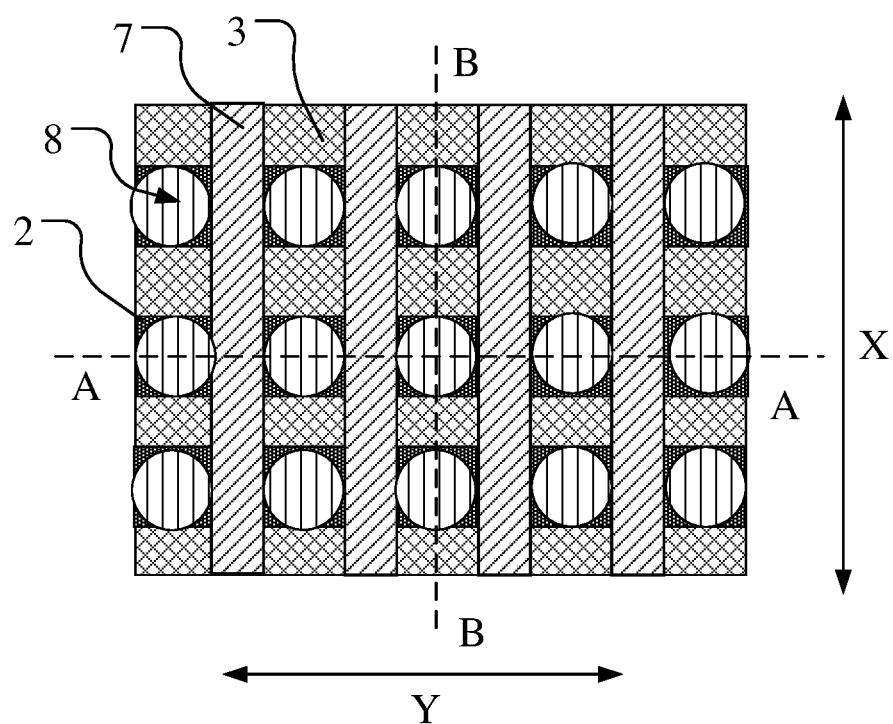
FIG. 43 is a top perspective view of a semiconductor structure semi-finished product in one exemplary embodiment of a manufacturing method of a semiconductor structure of the disclosure.
Figure 44:
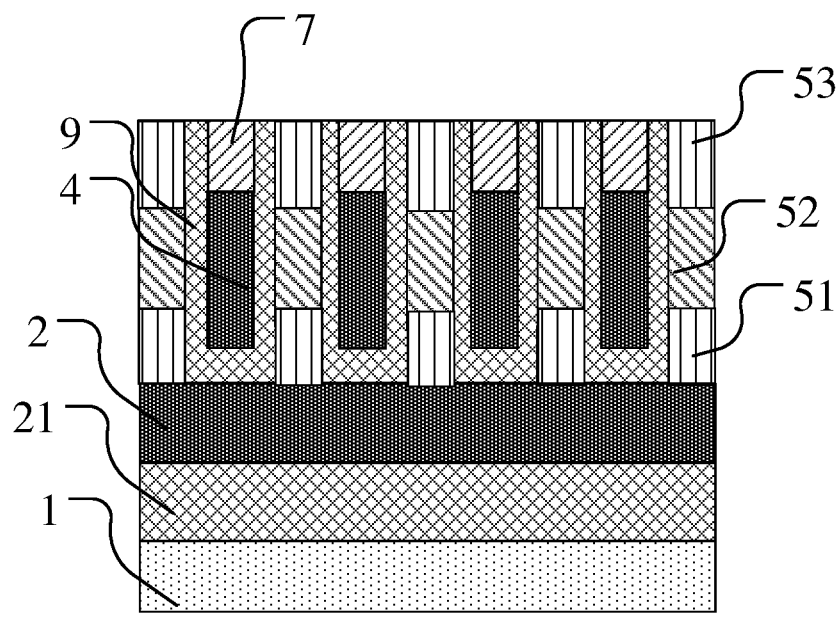
FIG. 44 is a cross-sectional view of a dotted line A-A in FIG. 43.
Figure 45:
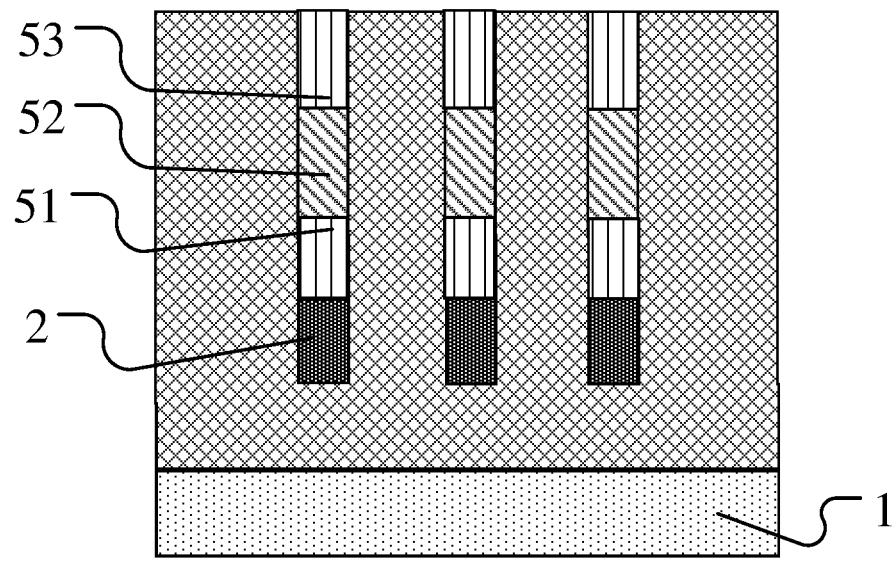
FIG. 45 is a cross-sectional view of a dotted line B-B in FIG. 43.

As shown in FIG. 43 to FIG. 45, FIG. 43 is a top perspective view of a semiconductor structure semi-finished product in one exemplary embodiment of a manufacturing method of a semiconductor structure of the disclosure; FIG. 44 is a cross-sectional view of a dotted line A-A in FIG. 43; and FIG. 45 is a cross-sectional view of a dotted line B-B in FIG. 43. In S6, a first source or drain part 51, an active part 52, and a second source or drain part 53 are formed in each through hole 8. The first source or drain part 51 is located on one side of the bit line 2 facing away from the base substrate 1, the active part 52 is located on one side of the first source or drain part 51 facing away from the bit line 2, and the second source or drain part 53 is located on one side of the active part 52 facing away from the bit line 2. Specifically, the operation that a first source or drain part 51, an active part 52, and a second source or drain part 53 are formed in each through hole 8 may include that: the through hole 8 is filled with a semiconductor material, and both sides of the semiconductor in the through hole 8 along an extension direction of the through hole 8 are doped to form the first source or drain part 51 and the second source or drain part 53 respectively. An undoped part between the first source or drain part 51 and the second source or drain part 53 forms the active part 52. The semiconductor material may be polysilicon, and the first source or drain part 51 and the second source or drain part 53 are formed through N-type doping or P-type doping. A doping ion may be a boron ion, a bismuth ion, a germanium ion, a cobalt ion, a phosphorus ion, and the like. In addition, the active part may also be doped lightly to adjust a resistance value of the active part. The orthographic projection of the active part 52 in a plane of the word line 4 may be on the word line 4. The first source or drain part 51 and the second source or drain part 53 may form a source or drain of a switch transistor in a memory cell, the active part 52 may form the active part of the switch transistor, a part of the word line 4 may form a gate of the switch transistor, and the fifth insulating layer 9 may form a gate insulating layer of the switch transistor.

Figure 46:
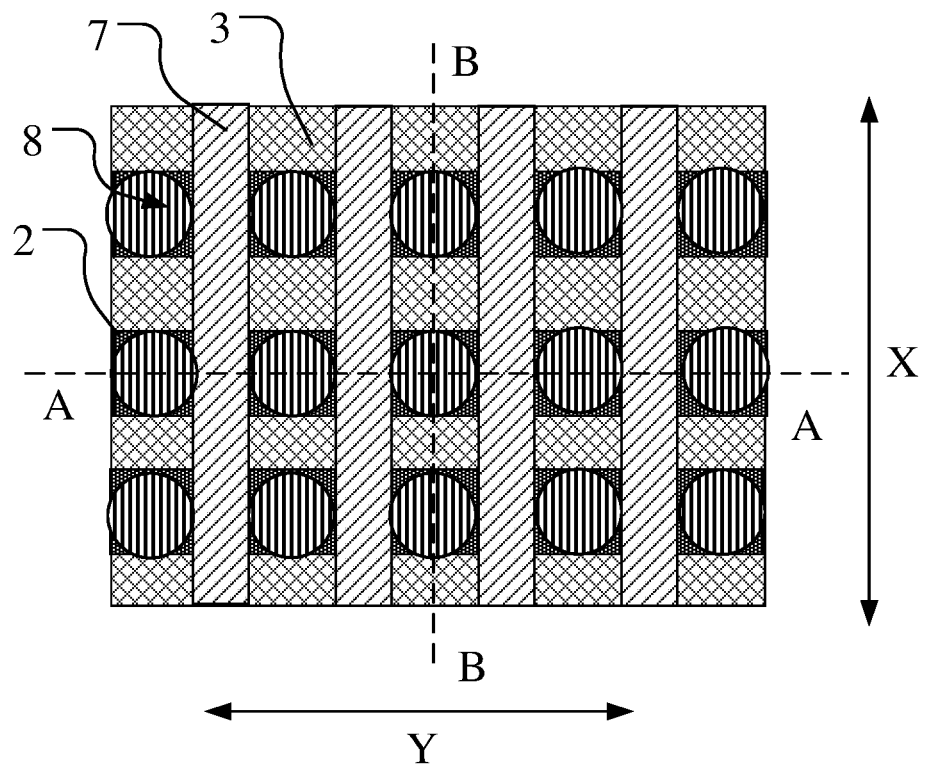
FIG. 46 is a top perspective view of a semiconductor structure semi-finished product in one exemplary embodiment of a manufacturing method of a semiconductor structure of the disclosure.
Figure 47:
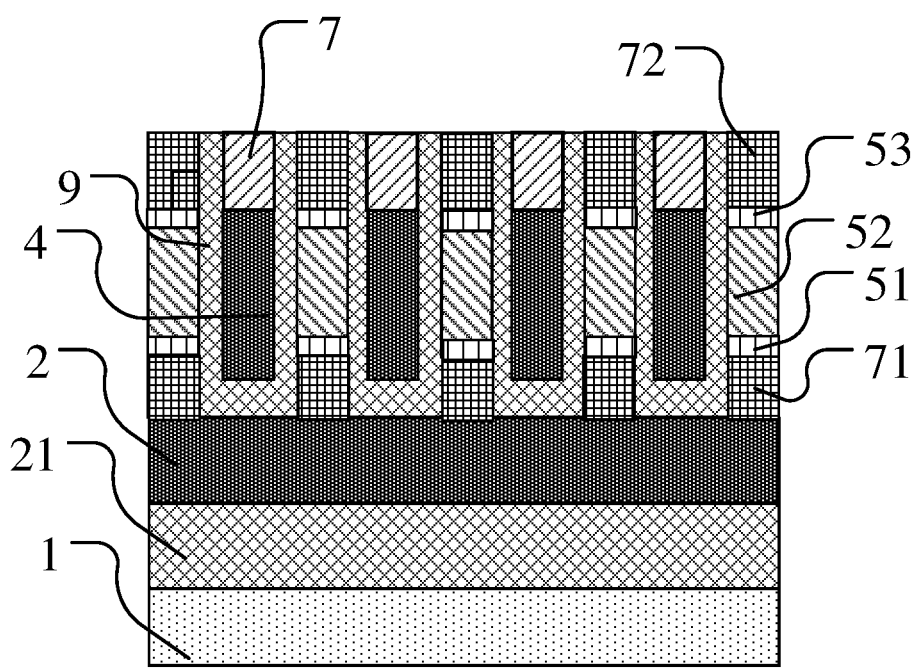
FIG. 47 is a cross-sectional view of a dotted line A-A in FIG. 46.
Figure 48:
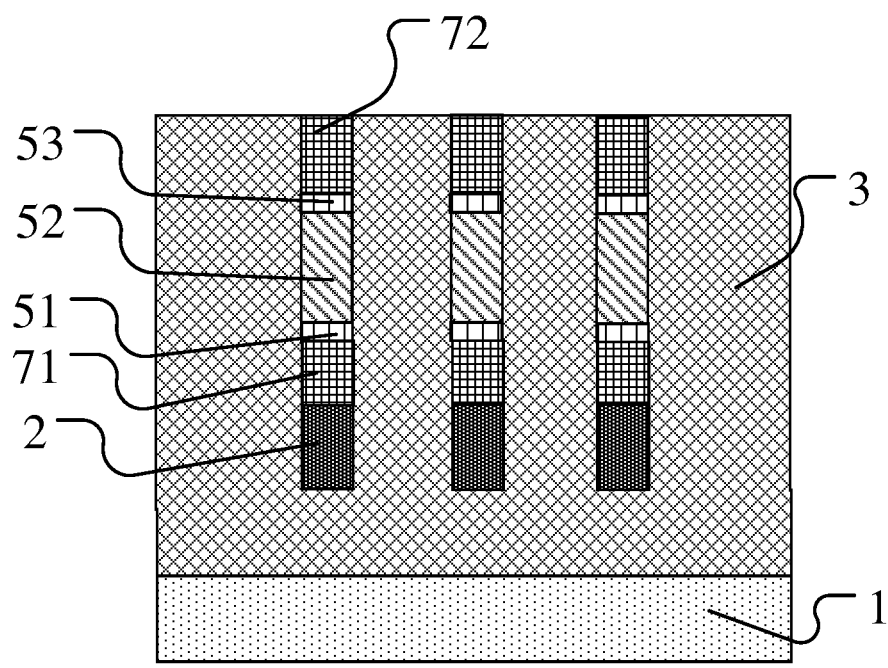
FIG. 48 is a cross-sectional view of a dotted line B-B in FIG. 46.

In the exemplary embodiment, as shown in FIG. 46 to FIG. 48, FIG. 46 is a top perspective view of a semiconductor structure semi-finished product in one exemplary embodiment of a manufacturing method of a semiconductor structure of the disclosure; FIG. 47 is a cross-sectional view of a dotted line A-A in FIG. 46; and FIG. 48 is a cross-sectional view of a dotted line B-B in FIG. 46.

Before the operation that a first source or drain part, an active part and a second source or drain part are formed in each through hole 8, the method may further include that: a first conductor part 71 is formed in the through hole 8, the first conductor part 71 being located between each bit line 2 and the first source or drain part 51. After the operation that a first source or drain part 51, an active part 52, and a second source or drain part 53 are formed in each through hole 8, the method may further include that: a second conductor part 72 is formed in the through hole 8, the second conductor part 72 is located at one side of the second source or drain part 53 facing away from the base substrate 1. The material of the first conductor part 71 and the second conductor part 72 may be conductive polysilicon or metal silicide.

The exemplary embodiments further provide a control method of a semiconductor structure. The method is configured to control the semiconductor structure and includes the following operation.

A turn-on signal is simultaneously input to two adjacent word lines to turn on an active body located between the two word lines, so that capacitance thereof is accessed. When the two word lines are turned on simultaneously, a PN junction clamped in a middle active body source drain region is inverted to form a passage so as to be turned on, while the PN junction in a side active body source drain region cannot be inverted and cannot form a complete passage due to insufficient gate voltage, so that two word lines and one bit line correspond to one capacitor to achieve the purpose of addressing.

Other embodiments of the disclosure will be apparent to those skilled in the art from consideration of the specification and practice of the content disclosed herein. The present application is intended to cover any variations, uses, or adaptations of the disclosure, and the variations, uses, or adaptations follow the general principles of the disclosure and include common general knowledge or conventional technical means in the art undisclosed by the disclosure. The specification and embodiments are considered as examples only, and a true scope and spirit of the disclosure are indicated by the claims.

It will be appreciated that the disclosure is not limited to the exact construction that has been described above and illustrated in the accompanying drawings, and that various modifications and changes can be made without departing from the scope thereof. The scope of the disclosure is only defined by the appended claims.

The invention claimed is:

1. A manufacturing method of a semiconductor structure, comprising:

forming a to-be-etched body, the to-be-etched body comprising a base substrate, an insulator located on one side of the base substrate and a plurality of bit lines, the bit lines being located in the insulator, and the plurality of bit lines being distributed at intervals along a first direction and extending along a second direction;

forming a plurality of second grooves, which are distributed at intervals along the second direction and extend along the first direction, on one side of the insulator facing away from the bit lines;

sequentially forming a word line and a fourth insulating layer in each second groove, the fourth insulating layer being located on one side of the word line facing away from a bottom of the second groove;

forming a plurality of through holes distributed in an array on one side of the insulator facing away from the base substrate, orthographic projection of each through hole on the base substrate at least partially coinciding with an orthographic projection of a respective bit line on the base substrate, the through hole extending to a surface of the bit line, and in the second direction, an orthographic projection of only one word line on the base substrate being located between the orthographic projections of two adjacent through holes on the base substrate;

forming a fifth insulating layer on one side of the word line exposed to the through hole; and forming a first source or drain part, an active part and a second source or drain part in each through hole, the first source or drain part being located on one side of a respective bit line, the active part being located on one side of the first source or drain part facing away from the bit line, and the second source or drain part being located on one side of the active part facing away from the bit line.

2. The method manufacturing of a semiconductor structure of claim 1, wherein forming the to-be-etched body comprises:

forming a substrate material layer, a plurality of first grooves, which are distributed at intervals along the first direction and extend along the second direction, being formed on one side surface of the substrate material layer;

forming a first insulating layer, the bit line and a second insulating layer in each first groove, the bit line being located on one side of the first insulating layer facing away from a bottom of the first groove, the second insulating layer being located on one side of the bit line facing away from the bottom of the first groove; and removing the substrate material layer on one side, facing an opening of the first groove, of a plane of the bottom of the first groove so as to form the remaining substrate material layer into the base substrate, and filling a third insulating layer at a position of a removed substrate material layer so as to form the third insulating layer, the first insulating layer and the second insulating layer into the insulator.

3. The manufacturing method of a semiconductor structure of claim 1, before forming the first source or drain part, the active part and the second source or drain part in each through hole, further comprising:

forming a first conductor part in the through hole, the first conductor part being located between the bit line and the first source or drain part; and after forming the first source or drain part, the active part and a second source or drain part in each through hole, further comprising:

forming a second conductor part in the through hole, the second conductor part being located on one side of the second source or drain part facing away from the base substrate.

4. The manufacturing method of a semiconductor structure of claim 1, wherein the insulator comprises:

a first insulator, located between each word line and a respective active body;

a second insulator, located on one side of each word line facing away from the base substrate; and a third insulator, located between each word line and a respective bit line; and wherein a hardness of the second insulator is greater than hardnesses of the first insulator and the third insulator.

5. The manufacturing method of a semiconductor structure of claim 4, wherein a material of the first insulator is silicon oxide, and a material of the second insulator is silicon nitride.

6. The manufacturing method of a semiconductor structure of claim 1, wherein the first direction is perpendicular to the second direction.

7. The manufacturing method of a semiconductor structure of claim 1, wherein each bit line and the base substrate are arranged to be insulated from one another through a respective part of the insulator.

8. The manufacturing method of a semiconductor structure of claim 1, wherein the first source or drain part and the second source or drain part are doped polysilicon conductors, and a material of the active part is polysilicon.

* * * * *